United States Patent
Tanimoto et al.

(10) Patent No.: US 9,966,526 B2
(45) Date of Patent: May 8, 2018

(54) PIEZOELECTRIC DEVICE AND PROCESS FOR PRODUCING PIEZOELECTRIC DEVICE

(71) Applicants: Mitsui Chemicals, Inc., Minato-ku (JP); Murata Manufacturing Co., Ltd., Kyoto (JP)

(72) Inventors: Kazuhiro Tanimoto, Chiba (JP); Mitsunobu Yoshida, Ichihara (JP); Masaki Shimizu, Sodegaura (JP); Shigeo Nishikawa, Chiba (JP); Yoshiro Tajitsu, Suita (JP)

(73) Assignees: MITSUI CHEMICALS, INC., Minato-Ku, Tokyo (JP); MURATA MANUFACTURING CO., LTD., Nagaokakyo-Shi, Kyoto (JP)

(*) Notice: Subject to any disclaimer, the term of this patent is extended or adjusted under 35 U.S.C. 154(b) by 636 days.

(21) Appl. No.: 14/403,800

(22) PCT Filed: Jun. 3, 2013

(86) PCT No.: PCT/JP2013/065382
§ 371 (c)(1),
(2) Date: Nov. 25, 2014

(87) PCT Pub. No.: WO2013/183594
PCT Pub. Date: Dec. 12, 2013

(65) Prior Publication Data
US 2015/0155474 A1    Jun. 4, 2015

(30) Foreign Application Priority Data
Jun. 5, 2012    (JP) ................ 2012-128295

(51) Int. Cl.
*H01L 41/193*    (2006.01)
*H01L 41/083*    (2006.01)
(Continued)

(52) U.S. Cl.
CPC ............ *H01L 41/193* (2013.01); *C08G 63/08* (2013.01); *H01L 41/047* (2013.01);
(Continued)

(58) Field of Classification Search
CPC . H01L 41/193; H01L 41/047; H01L 41/0471; H01L 41/83; C08G 63/08
(Continued)

(56) References Cited

U.S. PATENT DOCUMENTS

| 4,632,856 A | 12/1986 | Marcus et al. |
| 8,829,121 B2 * | 9/2014 | Yoshida ................. H01L 41/45 252/62.9 R |

(Continued)

FOREIGN PATENT DOCUMENTS

| CN | 102027609 A | 4/2011 |
| CN | 102349170 A | 2/2012 |

(Continued)

OTHER PUBLICATIONS

English Translation of KP 10-20110137361.*

(Continued)

*Primary Examiner* — Bryan Gordon
(74) *Attorney, Agent, or Firm* — Buchanan, Ingersoll & Rooney PC

(57) ABSTRACT

A piezoelectric device is provided that includes a polymer piezoelectric material having at least one film-like layer; a first electric conductor provided on a principal surface of the polymer piezoelectric material; a second electric conductor provided on a surface of the polymer piezoelectric material at an opposite side from the first electric conductor on the principal surface; a first end surface electric conductor provided on one end surface in a width direction of the polymer piezoelectric material and disposed so as to be conductively connected to the first electric conductor and so (Continued)

as not to be in contact with the second electric conductor; and a second end surface electric conductor provided on any other end surface that is not the one end surface of the polymer piezoelectric material and disposed in a defined manner.

8 Claims, 16 Drawing Sheets

(51) Int. Cl.
    *H01L 41/277*     (2013.01)
    *C08G 63/08*     (2006.01)
    *H01L 41/047*     (2006.01)
    *H01L 41/09*     (2006.01)
    *H01L 41/297*     (2013.01)

(52) U.S. Cl.
    CPC ........ *H01L 41/0471* (2013.01); *H01L 41/083* (2013.01); *H01L 41/0933* (2013.01); *H01L 41/277* (2013.01); *H01L 41/297* (2013.01); *Y10T 29/42* (2015.01)

(58) Field of Classification Search
    USPC .......................................... 310/328, 365, 800
    See application file for complete search history.

(56) References Cited

U.S. PATENT DOCUMENTS

| | | | | |
|---|---|---|---|---|
| 2004/0207292 | A1* | 10/2004 | Scher ...................... | F04D 33/00 310/328 |
| 2011/0109204 | A1* | 5/2011 | Tajitsu .................. | H01L 41/193 310/348 |
| 2012/0025674 | A1* | 2/2012 | Yoshida ................. | C08G 63/08 310/365 |

FOREIGN PATENT DOCUMENTS

| | | |
|---|---|---|
| JP | 61-182944 A | 8/1986 |
| JP | H03-236290 A | 10/1991 |
| JP | 5-152638 A | 6/1993 |
| JP | H05-308700 A | 11/1993 |
| JP | 6-188474 A | 7/1994 |
| JP | H09-196750 A | 7/1997 |
| JP | H11-198298 A | 7/1999 |
| JP | 2005-213376 A | 8/2005 |
| JP | 2006-305833 A | 11/2006 |
| JP | 2009-267528 A | 11/2009 |
| JP | 2010-042588 A | 2/2010 |
| JP | 2011-155573 A | 8/2011 |
| JP | 2011-208133 A | 10/2011 |
| JP | 2011-210865 A | 10/2011 |
| KR | 10-2011-0137361 A | 12/2011 |
| WO | 2009/139237 A1 | 11/2009 |
| WO | WO 2010/104196 A1 | 9/2010 |
| WO | WO 2012/026494 A1 | 3/2012 |

OTHER PUBLICATIONS

Office Action (Notice of Reasons for Rejection) issued in corresponding Japanese Patent Application No. 2014-519981 dated Mar. 10, 2015 (7 pages).
Office Action issued by the Korean Patent Office in corresponding Korean Patent Application No. 2014-7034061 dated Mar. 11, 2016 (6 pages including partial English translation).
Yoshida et al.: "Piezoelectric properties of poly(lactic acid) multilayer film", Kagurasaka, Tokyo, Sep. 12-13, 2011, 9 pages—with concise explanation.
Office Action issued by the Chinese Patent Office in corresponding Chinese Patent Application No. 201380029287.4 dated May 31, 2016 (15 pages with partial English translation).
International Search Report (PCT/ISA/210) dated Sep. 3, 2013, by the Japanese Patent Office as the International Searching Authority for International Application No. PCT/JP2013/065382.
Written Opinion (PCT/ISA/237) dated Sep. 3, 2013, by the Japanese Patent Office as the International Searching Authority for International Application No. PCT/JP2013/065382.
Yoshida et al., "Piezoelectric properties of poly(lactic acid) multilayer film", Kagurasaka, Tokyo, Sep. 12-13, 2011, 8 pages.
Yoshida et al., "Piezoelectric Motion of Multilayer Film with Alternate Rows of Optical Isomers of Chiral Polymer Film", The Japan Sociaty of Applied Physics, Feb. 24, 2014, 5 pages.
Notice of Reasons for Rejection issued by the Japanese Patent Office in corresponding Japanese Patent Application No. 2014-519981 dated Feb. 28, 2017 (21 pages including partial English translation).

* cited by examiner

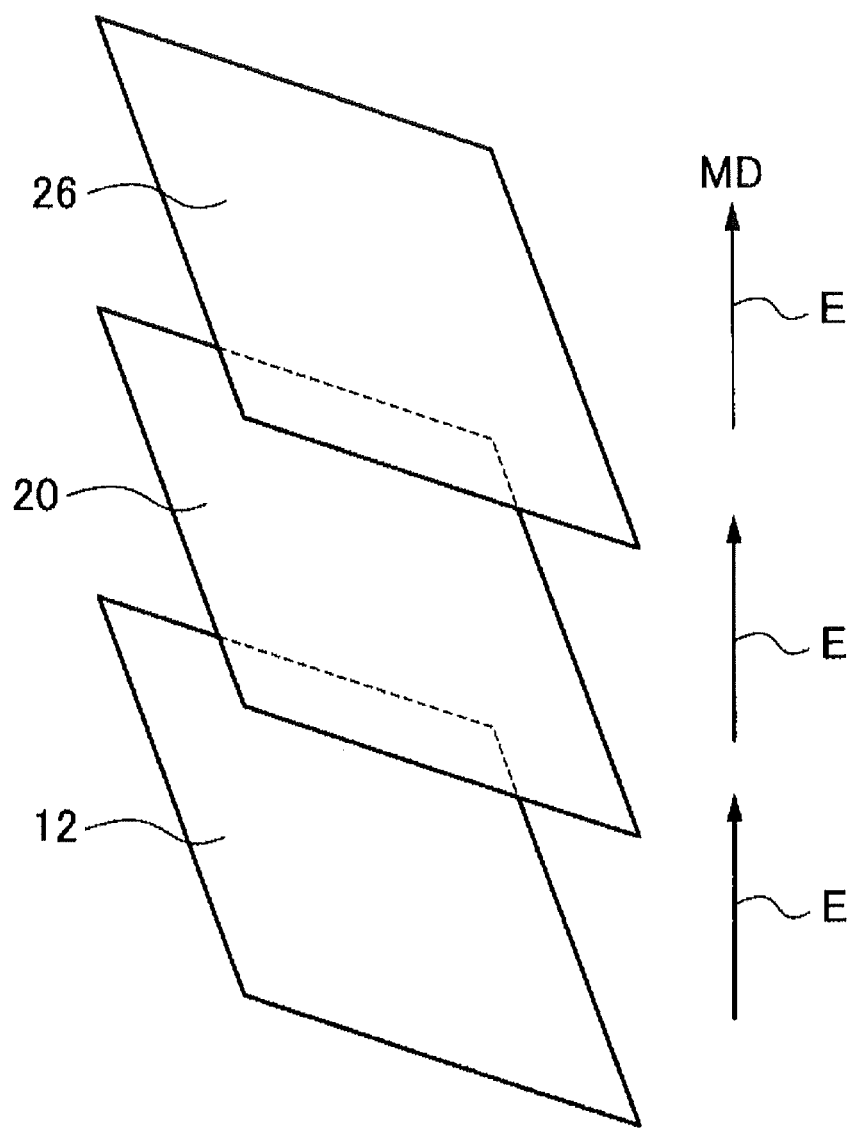

FILM A

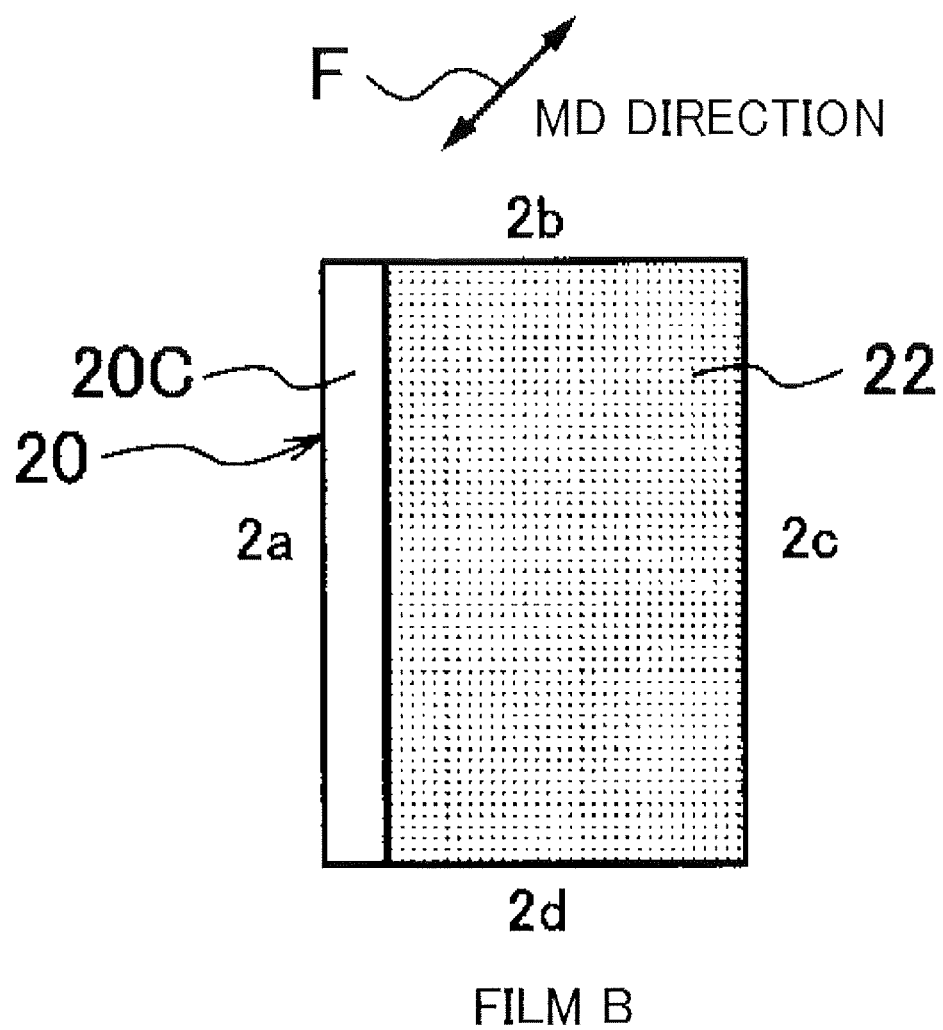

FILM C

FILM A

FILM B

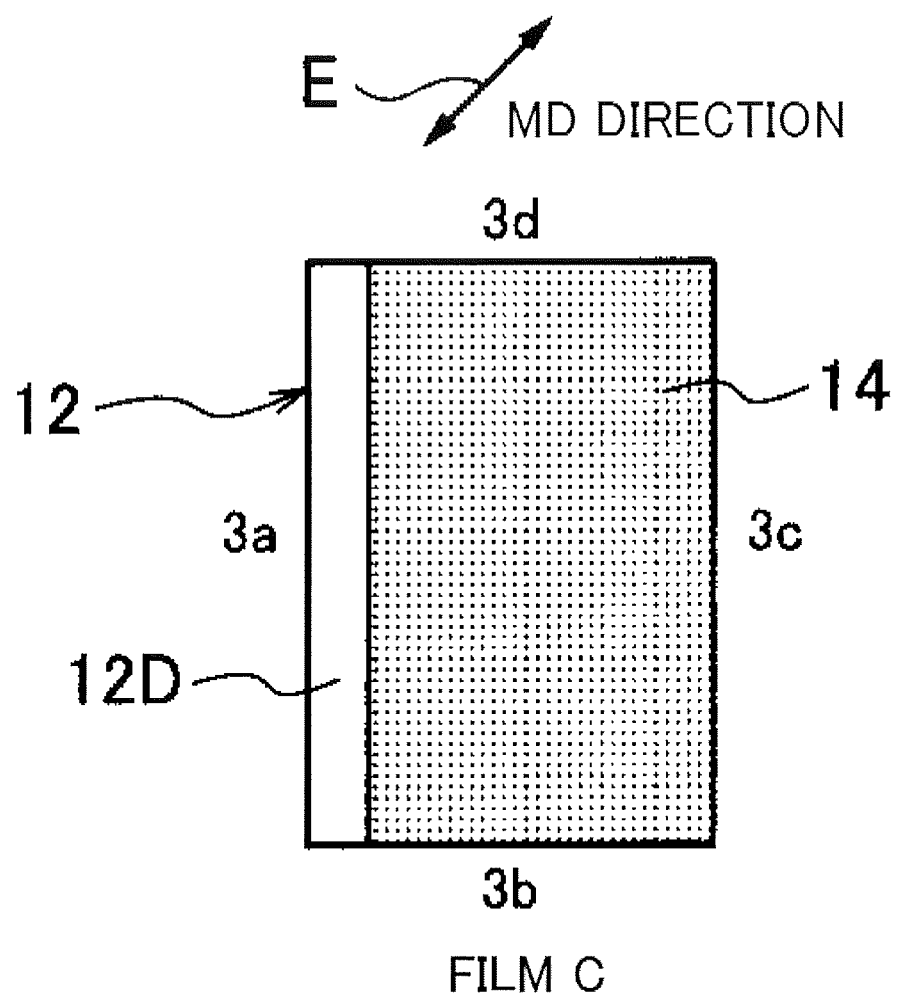

PIEZOELECTRIC DEVICE AND PROCESS FOR PRODUCING PIEZOELECTRIC DEVICE

TECHNICAL FIELD

The present invention relates to a piezoelectric device and a process for producing a piezoelectric device.

BACKGROUND ART

As a piezoelectric material, PZT (a $PBZrO_3$—$PbTiO_3$ solid solution), which is a ceramic material, has been used in many cases. However, since PZT contains lead, piezoelectric polymer materials having a low environmental impact and a high flexibility have been increasingly employed.

Currently known piezoelectric polymer materials are roughly classified mainly into the following two types, i.e., poled polymers typified by nylon 11, polyvinyl fluoride, polyvinyl chloride and polyurea; and ferroelectric polymers typified by polyvinylidene fluoride (β type) (PVDF) and a polyvinylidene fluoride-trifluoroethylene copolymer (P(VDF-TrFE)) (75/25).

However, since piezoelectric polymer materials are inferior to PZT in piezoelectricity, improvement in piezoelectricity is demanded. Thus, attempts have been made from various standpoints in order to improve the piezoelectricity of piezoelectric polymer materials.

For example, PVDF and P(VDF-TrFE), which are ferroelectric polymers, exhibit excellent piezoelectricity among polymers, and the piezoelectric constant $d_{31}$ thereof is 20 pC/N or more. Film material formed from PVDF or P(VDF-TrFE) is imparted with piezoelectricity by carrying out a stretching process in which polymer chains are oriented in a stretching direction; generating an electric field in a direction longitudinal to a film surface by providing different types of charges to a front side and a back side of the film by corona discharge or the like; and allowing permanent dipoles containing fluoride existing in a side chain of the polymer chains to be oriented in a direction parallel to the electric field direction. However, there has been a problem in practical use in that different types of charges, such as water or ions contained in air, are likely to adhere to the polarized film surface in a direction of canceling orientation; therefore, orientation of the aligned permanent dipoles may tend to cause a significant decrease in piezoelectricity over time.

PVDF is a material having the highest piezoelectricity among the piezoelectric polymer materials described above. However, since PVDF has a relatively high dielectric constant among the piezoelectric polymer materials, i.e., 13, the material has a small piezoelectric g constant (open-circuit voltage per unit stress), which is a value obtained by dividing the piezoelectric d constant by the dielectric constant. Further, although PVDF exhibits a favorable conversion efficiency from electricity to sound, a conversion efficiency from sound to electricity has yet to be improved.

In recent years, use of polymers having optical activity, such as polypeptide or polylactic acid, is attracting attention, in addition to the piezoelectric polymer materials described above. Polylactic acid polymers are known to demonstrate piezoelectricity by carrying out a mechanical stretching alone.

Among the polymers having optical activity, piezoelectricity of polymer crystals, such as polylactic acid, originates from permanent dipoles of a C=O bond being present in a screw axis direction. In particular, polylactic acid, which has a small volume fraction of a side chain to a main chain and a high ratio of permanent dipoles per volume, is an ideal polymer among polymers having helical chirality.

It is known that polylactic acid, which demonstrates piezoelectricity by a stretching process alone, does not require a poling process, and that the piezoelectric modulus does not decrease over the years.

As described above, polylactic acid has various types of piezoelectric properties, and thus, piezoelectric polymer materials using various kinds of polylactic acids have been reported.

For example, a piezoelectric polymer material that exhibits a piezoelectric modulus of approximately 10 pC/N at room temperature, obtained by subjecting a molded article of polylactic acid to a stretching process, is disclosed (see, for example, Japanese Patent Application Laid-Open (JP-A) No. 5-152638).

Moreover, in order to obtain highly oriented polylactic acid crystals, performing a special orientation process referred to as a forging method to achieve a piezoelectricity of approximately 18 pC/N has also been reported (e.g., JP-A No. 2005-213376).

DISCLOSURE OF THE INVENTION

Object to be Addressed

When a piezoelectric device is produced by using a piezoelectric material shown in JP-A Nos. 5-152638 or 2005-213376, it is preferable to dispose an electrode efficiently so that electrical wiring is easily formed. For example, in order to dispose the electrode efficiently, it is considered to form the electrode on an end surface of the piezoelectric material. The present inventors found that a piezoelectric constant $d_{14}$ of the piezoelectric material may be significantly lowered depending on the disposition of the electrode.

In view of the above circumstances, an object or the present invention is to provide a piezoelectric device, which prevents a piezoelectric constant $d_{14}$ of a polymer piezoelectric material from being significantly lowered when an electric conductor is formed on an end surface of the polymer piezoelectric material, and a process for producing a piezoelectric device.

Means for Addressing the Object

The following are specific measures for achieving the object.

<1> A piezoelectric device, including a polymer piezoelectric material having at least one film-like layer; a first electric conductor provided on a principal surface of the polymer piezoelectric material; a second electric conductor provided on a surface of the polymer piezoelectric material at an opposite side from the first electric conductor on the principal surface; a first end surface electric conductor provided on one end surface in a width direction of the polymer piezoelectric material and disposed so as to be conductively connected to the first electric conductor and so as not to be in contact with the second electric conductor; and a second end surface electric conductor provided on any other end surface that is not the one end surface of the polymer piezoelectric material and disposed so as to be conductively connected to the second electric conductor and so as not to be in contact with the first electric conductor or the first end surface electric conductor.

<2> The piezoelectric device described in <1>, wherein, when a sum of an area of the first electric conductor provided on the principal surface of the polymer piezoelectric material and an area of the second electric conductor provided on the opposite surface is represented by D1, and when a sum of an area of the principal surface at which the first electric conductor is not provided and an area of the opposite surface at which the second electric conductor is not provided is represented by D2, D1/D2 is 10 or more.

<3> The piezoelectric device described in <1> or <2>, wherein the polymer piezoelectric material is configured to include a helical chiral polymer having a weight average molecular weight of from 50,000 to 1,000,000 and having optical activity, and a degree of crystallinity of the polymer piezoelectric material as obtained by a DSC method is from 20% to 80%.

<4> The piezoelectric device described in any one of <1> to <3>, further comprising an adhesive layer that adheres the polymer piezoelectric material and the first electric conductor or the second electric conductor to each other, wherein a tensile storage elastic modulus E' of the adhesive layer, which is obtained from dynamic viscoelastic measurement at 25° C. as measured at a frequency of 0.01 Hz, is from $1\times10^2$ to $1\times10^9$ Pa.

When the shear storage elastic modulus G' is obtained from dynamic viscoelastic measurement, the shear storage elastic modulus G' is converted into E' by using E'=G'×3.

<5> The piezoelectric device described in any one of <1> to <4>, wherein a tensile storage elastic modulus E' of the adhesive layer, which is obtained from dynamic viscoelastic measurement at 25° C. as measured at a frequency of 0.01 Hz, is $1\times10^6$ Pa or more, and a loss tangent is 0.03 or more.

When the shear storage elastic modulus G' is obtained from dynamic viscoelastic measurement, the shear storage elastic modulus G' is converted into E' by using E'=G'×3.

<6> The piezoelectric device described in any one of <1> to <5>, wherein another polymer piezoelectric material having at least one film-like layer and a third electric conductor provided on a principal surface side of the another polymer piezoelectric material are sequentially layered along a thickness direction on a surface of the second electric conductor formed on the principal surface side of the polymer piezoelectric material, while the first end surface electric conductor extends on one end surface in a width direction of the another polymer piezoelectric material, the second end surface electric conductor extends on the other end surface in the width direction of the another polymer piezoelectric material, and the third electric conductor is disposed so as to be conductively connected to the first end surface electric conductor and so as not to be in contact with the second end surface electric conductor.

<7> The piezoelectric device described in any one of <1> to <6>, wherein a transmission haze with respect to visible light of the polymer piezoelectric material is from 0.0% to 50%.

<8> The piezoelectric device described in any one of <3> to <7>, wherein the helical chiral polymer is a polylactic acid polymer having a main chain that comprises a repeating unit represented by the following Formula (1):

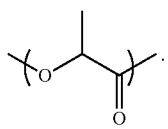

(1)

<9> The piezoelectric device described in any one of <3> to <8>, wherein each of the polymer piezoelectric material and the another polymer piezoelectric material is formed from a layer mainly composed of an L-isomer of the helical chiral polymer and the polymer piezoelectric material and the another polymer piezoelectric material are arranged so that a uniaxial stretching direction of the polymer piezoelectric material intersects a uniaxial stretching direction of the another polymer piezoelectric material.

<10> The piezoelectric device described in <3> to <8>, wherein while one of the polymer piezoelectric material and the another polymer piezoelectric material is formed from a layer mainly composed of an L-isomer of the helical chiral polymer, the other of the polymer piezoelectric material and the another polymer piezoelectric material is formed from a layer mainly composed of a D-isomer of the helical chiral polymer, and the polymer piezoelectric material and the another polymer piezoelectric material are arranged so that a uniaxial stretching direction of the polymer piezoelectric material is the same as a uniaxial stretching direction of the another polymer piezoelectric material.

<11> The piezoelectric device described in any one of <3> to <10>, wherein the helical chiral polymer has an optical purity of 95.00% ee or more.

<12> A process for producing the piezoelectric device described in any one of <1> to <5>, the process including: forming a first electric conductor on a principal surface of a film-like polymer piezoelectric material, except for at a part at the other end in a width direction and forming a second electric conductor on a surface at an opposite side from the first electric conductor, except for at a part at the one end in the width direction; forming a first end surface electric conductor on the one end surface in the width direction of the polymer piezoelectric material so that the first end surface electric conductor is in contact with the first electric conductor and is not in contact with the second electric conductor; and forming a second end surface electric conductor on the other end surface in the width direction of the polymer piezoelectric material so that the second end surface electric conductor is in contact with the second electric conductor and is not in contact with the first electric conductor.

<13> A process for producing the piezoelectric device described in <6>, the process including: forming a first electric conductor on a principal surface of a film-like polymer piezoelectric material, except for at a part at the other end in the width direction and forming a second electric conductor on a surface at an opposite side from the first electric conductor, except for at a part at the one end in the width direction; forming a third electric conductor on a principal surface of another film-like polymer piezoelectric material, except for at a part at the other end in the width direction; adhering a surface at an opposite side from the third electric conductor on the principal surface of the another polymer piezoelectric material to a surface of the polymer piezoelectric material on which the second electric conductor is formed via an adhesive layer; forming a first end surface electric conductor on the one end surface in the width direction of the polymer piezoelectric material and the another polymer piezoelectric material so that the first end surface electric conductor is in contact with the first electric conductor and the third electric conductor and is not in contact with the second electric conductor; and forming a second end surface electric conductor on the other end surface in the width direction of the polymer piezoelectric material and the another polymer piezoelectric material so that the second end surface electric conductor is in contact with the second electric conductor and is not in contact with the first electric conductor or the third electric conductor.

Effect of the Invention

According to a piezoelectric device and a process for producing a piezoelectric device according to the present invention, when an electric conductor is formed on an end surface of a polymer piezoelectric material, a piezoelectric constant $d_{14}$ of the polymer piezoelectric material is not significantly lowered.

BRIEF DESCRIPTION OF DRAWINGS

FIG. 6 is a view showing an example in which the polymer piezoelectric materials used in the piezoelectric device shown in FIG. 3 are layered in order of a layer mainly composed of the L-isomer of the helical chiral polymer, a layer mainly composed of a D-isomer of the helical chiral polymer, and a layer mainly composed of the L-isomer of the helical chiral polymer and is a schematic exploded perspective view showing the uniaxial stretching direction of each polymer piezoelectric material.

FIG. 7B is a view showing a front surface of a second polymer piezoelectric material (film B) used in the piezoelectric device of the first exemplary embodiment of the invention.

FIG. 8C is a view showing a back surface of the first polymer piezoelectric material (film C) used in the piezoelectric device of the first exemplary embodiment of the invention.

BEST MODE FOR CARRYING OUT THE INVENTION

First Exemplary Embodiment

Hereinafter, a first exemplary embodiment of a piezoelectric device according to the present invention will be described with reference to the drawings. The piezoelectric device according to the invention is not limited to one formed of only a polymer piezoelectric material in which an electric conductor is disposed on a principal surface, as in a first exemplary embodiment to be described later and includes a piezoelectric device in which two or more polymer piezoelectric materials to be described later are layered as if the first exemplary embodiment is repeatedly layered.

<Configuration of Piezoelectric Device 10>

Figure 1:
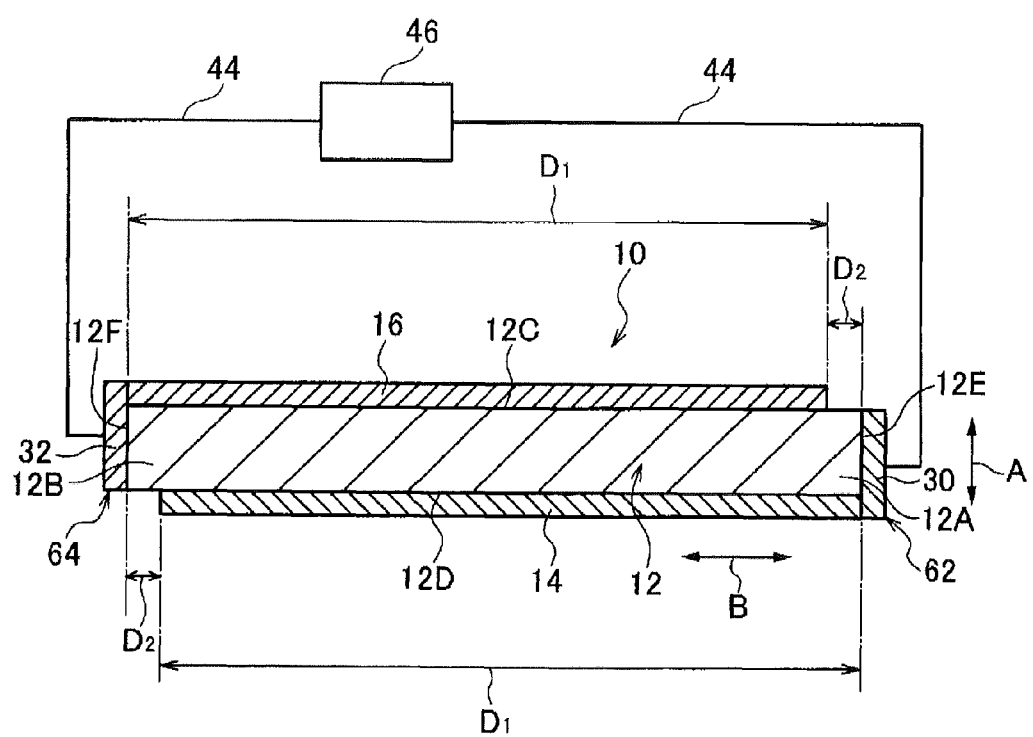
FIG. 1 is a cross-sectional view showing a piezoelectric device of a first exemplary embodiment of the present invention.

FIG. 1 shows a cross-sectional view of a piezoelectric device 10 of the first exemplary embodiment.

As shown in FIG. 1, the piezoelectric device 10 is provided with a film-like first polymer piezoelectric material (polymer piezoelectric material) 12, a first electric conductor 14 provided on a principal surface of the first polymer piezoelectric material 12 (a back surface 12D in this embodiment), and a second electric conductor 16 provided on a front surface 12C (a surface at an opposite side from the first electric conductor 14) of the first polymer piezoelectric material 12.

The first polymer piezoelectric material 12 is formed into a substantially rectangular shape in plan view. The second electric conductor 16 is not formed on the front surface 12C following the end part 12A at the one side in a width direction (a direction parallel to the principal surface shown by an arrow B) of the first polymer piezoelectric material 12. The second electric conductor 16 is formed on the other front surface 12C of the first polymer piezoelectric material 12, that is, the front surface 12C including the end part 12B at the other side in the with direction of the first polymer piezoelectric material 12. The first electric conductor 14 is not formed on the back surface 12D following the end part 12B at the other side in the direction of the first polymer piezoelectric material 12. The first electric conductor 14 is formed on the other back surface 12D of the first polymer piezoelectric material 12, that is, the back surface 12D including the end part 12A at the one side in the with direction of the first polymer piezoelectric material 12.

The piezoelectric device 10 is further provided with a first end surface electric conductor 30 provided on one end surface 12E in the width direction (the direction parallel to the principal surface shown by the arrow B) of the first polymer piezoelectric material 12 and a second end surface electric conductor 32 provided on the other end surface (any other end surface that is not the one end surface 12E) 12F in the width direction of the first polymer piezoelectric material 12. The first end surface electric conductor 30 is disposed so as to be in contact with the first electric conductor 14 and conductively connected to the first electric conductor 14 and so as not to be in contact with the second electric conductor 16. The second end surface electric conductor 32 is disposed so as to be in contact with the second electric conductor 16 and conductively connected to the second electric conductor 16 and so as not to be in contact with the first electric conductor 14. In this embodiment, the first end surface electric conductor 30 and the second end surface electric conductor 32 are provided on both sides in the width direction of the first polymer piezoelectric material 12 and are not in contact with each other.

The second end surface electric conductor 32 is not limited to the other end surface 12F in the width direction of the first polymer piezoelectric material 12 and may be provided on an end surface (any other end surface that is not the one end surface 12E) perpendicular to the one end surface 12E of the first polymer piezoelectric material 12, for example. In this case, it is preferable that the first end surface electric conductor 30 and the second end surface electric conductor 32 are provided so as not to be in contact with each other.

In the piezoelectric device 10, one electrode 62 (in this embodiment, a negative electrode, for example) formed by the first electric conductor 14 and the first end surface electric conductor 30, and another electrode 64 (in this embodiment, a positive electrode, for example) is formed by the second electric conductor 16 and the second end surface electric conductor 32. The first end surface electric conductor 30 constituting the electrode 62 and the second end surface electric conductor 32 constituting the electrode 64 are connected to an electrical circuit 46 through a lead wire 44. The electrical circuit 46 applies a predetermined voltage to the electrodes 62 and 64 and thereby deforms the first polymer piezoelectric material 12 mainly in a direction perpendicular to a thickness direction.

In the piezoelectric device 10, a sum of an area of the first electric conductor 14 provided on the principal surface (the back surface 12D) of the first polymer piezoelectric material 12 and an area of the second electric conductor 16 provided on an opposite surface (the front surface 12C) of the first polymer piezoelectric material 12 is represented by D1. Meanwhile, a sum of an area of a portion of the principal surface (the back surface 12D) of the first polymer piezoelectric material 12 at which the first electric conductor 14 is not provided and an area of a portion of the opposite surface (the front surface 12C) of the first polymer piezoelectric material 12 at which the second electric conductor 16 is not provided is represented by D2. In this case, D1/D2 is preferably 10 or more. D1/D2 is more preferably 15 or more, still more preferably 17 or more. When D1/D2 is in the range, the shape of the electric conductor and the shape of the area of a portion of the principal surface where no electric conductor is provided are not limited.

The first polymer piezoelectric material 12 is configured to include a helical chiral polymer having a weight average molecular weight of from 50,000 to 1,000,000 and having optical activity, and a degree of crystallinity of the polymer piezoelectric material as obtained by a DSC method is preferably from 20% to 80%. In another preferred embodiment, the first polymer piezoelectric material 12 does not include the helical chiral polymer but PVDF or P (VDF-TrEF) as a ferroelectric polymer. The polymer piezoelectric material is not necessarily constituted of one kind of material, and, for example, two polymer piezoelectric materials layered via no electric conductor may be used as the polymer piezoelectric material of the present invention.

When the piezoelectric device 10 has the above configuration, the piezoelectric constant $d_{14}$ of the first polymer piezoelectric material 12 is not significantly lowered when the first end surface electric conductor 30 and the second end surface electric conductor 32 are formed on the end surfaces on both sides in the width direction of the first polymer piezoelectric material 12.

In this embodiment, the polymer piezoelectric material usually means that the piezoelectric constant $d_{14}$ measured at 25° C. by a displacement method is 1 pm/V or more.

The term "piezoelectric constant $d_{14}$" refers to one of the piezoelectric modulus tensors. When a shearing stress is applied along the stretching axis direction of a stretched material, and when polarization occurs in a direction in which the shearing stress is applied, the density of charges generated per unit shearing stress is defined as $d_{14}$. The greater the value of the piezoelectric constant $d_{14}$ is, the higher the piezoelectricity is.

In this embodiment, the mere usage of the phase "piezoelectric constant" refers to "piezoelectric constant $d_{14}$".

As used herein, the piezoelectric constant $d_{14}$ is a value calculated by a method as described below. That is, a rectangular film of which the diagonal direction of 45° with respect to a stretching direction is its longitudinal direction is used as a test piece. If electrode layers are placed on the whole front and back face of the principal plane of this test piece and an applied voltage E (V) is applied to the electrodes, an amount of the longitudinal deformation of the film is represented by X. If a value obtained by dividing the applied voltage E (V) by a film thickness t (m) is an electric field strength E (V/m) and the amount of the longitudinal deformation of the film is X when applying E (V), $d_{14}$ is a value defined as 2×amount of deformation X/electric field strength E (V/m).

In addition, a complex piezoelectric modulus $d_{14}$ is calculated as "$d_{14}=d_{14}'-id_{14}''$" and "$d_{14}'$" and "$id_{14}''$" are obtained by "Rheolograph-Solid S-1 type" manufactured by Toyo Seiki Seisaku-sho, Ltd. "$d_{14}'$" represents the real part of the complex piezoelectric modulus, "$id_{14}''$" represents the imaginary part of the complex piezoelectric modulus, and $d_{14}'$ (real part of complex piezoelectric modulus) is equivalent to the piezoelectric constant $d_{14}$ in accordance with this embodiment.

In addition, the higher real part of the complex piezoelectric modulus indicates a more excellent piezoelectric characteristic.

The piezoelectric constants $d_{14}$ are one (unit: pm/V) measured by a displacement method and the other (unit: pC/N) measured by a resonance method.

<Process for Producing Piezoelectric Device of First Exemplary Embodiment>

Next, a process for producing a piezoelectric device according to the invention will be described using the first exemplary embodiment as an example.

The second electric conductor 16 is provided on the front surface 12C of the first polymer piezoelectric material 12, except for at the end part 12A at the one side in the width direction. While a portion of the front surface of the end part 12A side of the first polymer piezoelectric material 12 is masked, for example, the second electric conductor 16 is formed by metal vapor deposition or formed of an electroconductive polymer. The second electric conductor 16 may be adhered to the front surface of the first polymer piezoelectric material 12 via an adhesive layer consisting of an adhesive.

The first electric conductor 14 is provided on the back surface 12D of the first polymer piezoelectric material 12, except for at the end part 12B at the other side in the width direction. The first electric conductor 14 is formed by a method similar to the method for the second electric conductor 16.

After that, the first end surface electric conductor 30 is formed on the one end surface 12E in the width direction of the first polymer piezoelectric material 12. The first end surface electric conductor 30 is formed so as to be in contact with the first electric conductor 14 and so as not to be in contact with the second electric conductor 16.

The second end surface electric conductor 32 is formed on the other end surface 12F in the width direction of the first polymer piezoelectric material 12. The second end surface electric conductor 32 is formed so as to be in contact with the second electric conductor 16 and so as not to be in contact with the first electric conductor 14.

The first end surface electric conductor 30 and the second end surface electric conductor 32 are formed by coating a conductive paste onto the end surfaces on both sides in the width direction of the first polymer piezoelectric material 12, for example.

According to the process for producing the piezoelectric device 10, when the first end surface electric conductor 30 and the second end surface electric conductor 32 are formed on the end surfaces on both sides in the width direction of the first polymer piezoelectric material 12, the piezoelectric constant $d_{14}$ is not significantly lowered.

<Polymer Piezoelectric Material of this Exemplary Embodiment>

The polymer piezoelectric material of this embodiment will be described. As described above, the polymer piezoelectric material is configured to include a helical chiral polymer having a weight average molecular weight of from 50,000 to 1,000,000 and having optical activity, and the degree of crystallinity of the polymer piezoelectric material as obtained by a DSC method is preferably from 20% to 80%. In another preferred embodiment, the polymer piezoelectric material includes PVDF or P (VDF-TrEF) as a ferroelectric polymer. In the present application, although an aspect in which the polymer piezoelectric material includes the helical chiral polymer will be mainly described as a particularly preferred aspect, an aspect in which the polymer piezoelectric material does not include the helical chiral polymer but PVDF or P (VDF-TrEF) as a ferroelectric polymer is not eliminated.

[Helical Chiral Polymer Having Optical Activity]

The helical chiral polymer having optical activity refers to a polymer having a spiral molecular structure and having molecular optical activity.

Examples of the helical chiral polymer having optically activity (hereinafter, also referred to as an "optically active polymer") include polypeptides, cellulose derivatives, polylactic acid-based resins, polypropylene oxides, and poly(β-hydroxy butyric acid).

Examples of the polypeptide include poly(γ-benzyl glutaric acid) and poly(γ-methyl glutaric acid).

Examples of the cellulose derivative include cellulose acetate and cyanoethyl cellulose.

The optically active polymer preferably has an optical purity of 95.00% ee or more, more preferably 99.00% ee or more, and still more preferably 99.99% ee or more, from the viewpoint of improving the piezoelectricity of the piezoelectric polymer material. The optical purity is desirably 100.00% ee. It is considered that by adjusting the optical purity of the optically active polymer to be in the range mentioned above, a packing property of polymer crystals that demonstrate piezoelectricity is increased, whereby the piezoelectricity is increased.

In the present embodiment, the optical purity of the optically active polymer is a value calculated by the following equation.

Optical purity(% ee)=100×|L isomer amount−D isomer amount|/(L isomer amount+D isomer amount)

More specifically, the optical purity is defined as a value obtained by dividing the difference (absolute value) between the L isomer amount (% by mass) of the optically active polymer and the D isomer amount (% by mass) of the optically active polymer by the total of the L isomer amount (% by mass) of the optically active polymer and the D isomer amount (% by mass) of the optically active polymer, and multiplying the quotient by 100.

For the L isomer amount [% by mass] of the optically active polymer and the D isomer amount [% by mass] of the optically active polymer, values obtained by a method using high performance liquid chromatography (HPLC) are used. The specifics of the measurement will be described later.

Among the optically active polymers described above, a compound including a main chain that contains a repeating unit represented by the following Formula (1) is preferable from the viewpoint of increasing the optical purity and improving the piezoelectricity.

(1)

Examples of the compound containing a repeating unit represented by Formula (1) as a main chain include polylactic acid resins. Among these, polylactic acid is preferred, and a homopolymer of L-lactic acid (PLLA) or a homopolymer of D-lactic acid (PDLA) is most preferred.

The polylactic acid resin refers to any one of polylactic acid, a copolymer of L-lactic acid or D-lactic acid and a polyfunctional compound capable of being copolymerized with L-lactic acid or D-lactic acid, or a mixture thereof.

Polylactic acid is a polymer having a long chain structure formed by polymerization of lactic acid via ester bonding, and it is known that polylactic acid can be produced by a lactide method in which lactide is produced as an intermediate, a direct polymerization method including heating lactic acid in a solvent under a reduced pressure, and polymerizing the same while removing water, or the like. Examples of the polylactic acid include a homopolymer of L-lactic acid, a homopolymer of D-lactic acid, a block copolymer containing a polymer of at least one of L-lactic acid and D-lactic acid, and a graft copolymer containing a polymer of at least one of L-lactic acid and D-lactic acid.

Examples of the copolymerizable polyfunctional compound include hydroxycarboxylic acid, such as glycolic acid, dimethyl glycolic acid, 3-hydroxybutyric acid, 4-hydroxybutyric acid, 2-hydroxypropanoic acid, 3-hydroxypropanoic acid, 2-hydroxyvaleric acid, 3-hydroxyvaleric acid, 4-hydroxyvaleric acid, 5-hydroxyvaleric acid, 2-hydroxycaproic acid, 3-hydroxycaproic acid, 4-hydroxycaproic acid, 5-hydroxycaproic acid, 6-hydroxycaproic acid, 6-hydroxymethyl caproic acid, and mandelic acid; cyclic ester, such as glycolide, β-methyl-δ-valerolactone, γ-valerolactone, and ε-caprolactone; polyvalent carboxylic acid, such as oxalic acid, malonic acid, succinic acid, glutaric acid, adipic acid, pimelic acid, azelaic acid, sebacic acid, undecanedioic acid, dodecanedioic acid, and terephthalic acid, and anhydrides thereof; polyhydric alcohol, such as ethylene glycol, diethylene glycol, triethylene glycol, 1,2-propanediol, 1,3-propanediol, 1,3-butanediol, 1,4-butanediol, 2,3-butanediol, 1,5-pentanediol, 1,6-hexanediol, 1,9-nonanediol, 3-methyl-1,5-pentanediol, neopentylglycol, tetramethyleneglycol, and 1,4-hexanedimethanol; polysaccharide, such as cellulose; and aminocarboxylic acid, such as α-amino acid.

Examples of the copolymer of lactic acid and a polyfunctional compound capable of being copolymerized with lactic acid include a block copolymer or a graft copolymer having a polylactic acid sequence capable of generating a spiral crystal.

The polylactic acid resin can be manufactured by, for example, a method disclosed in JP-A No. 59-096123 or 7-033861 in which a polylactic acid resin is obtained by performing direct dehydration condensation of lactic acid; a method disclosed in U.S. Pat. No. 2,668,182, U.S. Pat. No. 4,057,357, etc. in which ring opening polymerization is performed using lactide which is a cyclic dimer of lactic acid.

In order that the optically active polymer obtained by the manufacturing methods described above has an optical purity of 95.00% ee or more, when polylactic acid is produced by a lactide method, for example, it is preferable to polymerize lactide whose optical purity has been increased to an optical purity of 95.00% ee or more by crystallization operation.

[Weight Average Molecular Weight of Optically Active Polymer]

The weight average molecular weight (Mw) of the optically active polymer according to the present embodiment is from 50,000 to 1,000,000.

When the lower limit of the weight average molecular weight of the optically active polymer is lower than 50,000, the mechanical strength of an article formed from the optically active polymer is insufficient. The lower limit of the weight average molecular weight of the optically active polymer is preferably 100,000 or more, and more preferably 200,000 or more. In contrast, when the upper limit of the weight average molecular weight of the optically active polymer exceeds 1,000,000, molding, such as extrusion molding, of an article such as a film formed from the optically active polymer may be difficult to perform. The upper limit of the weight average molecular weight is preferably 800,000 or lower, and more preferably 300,000 or lower.

The molecular weight distribution (Mw/Mn) of the optically active polymer is preferably from 1.1 to 5, and more preferably from 1.2 to 4, from the viewpoint of the strength of a piezoelectric polymer material. The molecular weight distribution is further preferably from 1.4 to 3.

Meanwhile, the weight average molecular weight (Mw) and the molecular weight distribution (Mw/Mn) of the polylactic acid polymer are measured by the following GPC measurement method by using gel permeation chromatograph (CPC).

—GPC Measurement Device—
GPC-100, manufactured by Waters
—Column—
SHODEX LF-804, manufactured by Showa Denko K.K
—Preparation of Sample—
Polylactic acid polymer is dissolved in a solvent (for example, chloroform) at 40° C., thereby preparing a sample solution with a concentration of 1 mg/ml.

—Measurement Conditions—
0.1 ml of the sample solution was introduced into a column with a solvent (chloroform) at a temperature of 40° C. at a flow rate of 1 ml/min.

The sample concentration in the sample solution separated in the column is measured with a differential refractometer. A universal calibration curve with a polystyrene standard sample is created to calculate the weight average molecular weight (Mw) and the molecular weight distribution (Mw/Mn) of the polylactic acid polymer.

As a polylactic acid polymer, commercially available polylactic acid may be used and examples include PURASORB (PD and PL) manufactured by PURAC, and LACEA (H-100 and H-400), manufactured by Mitsui Chemicals, Inc.

When a polylactic acid resin is used as the optically active polymer, it is preferable to produce the optically active polymer by a lactide method or a direct polymerization method in order to obtain a polylactic acid resin having a weight average molecular weight (Mw) of 50,000 or more.

[Other Components]

The piezoelectric polymer material of the present embodiment may contain other components, such as a known resin typified by polyvinylidene fluoride, polyethylene resin or polystyrene resin, inorganic fillers, such as silica, hydroxyapatite or montmorillonite, known crystal nucleating agents, such as phthalocyanine, in addition to the helical chiral polymer, insofar as the advantageous effect of the present embodiment is not impaired.

—Inorganic Fillers—

For example, in order to form a piezoelectric polymer material into a transparent film in which generation of voids, such as bubbles, is suppressed, inorganic fillers, such as hydroxy apatite, may be nano-dispersed into the piezoelectric polymer material. However, in order to allow an inorganic filler to be nano-dispersed, a large amount of energy is required for crushing aggregates. On the other hand, when the filler is not nano-dispersed, transparency of the film may decrease in some cases. When the piezoelectric polymer material according to the present embodiment contains an inorganic filler, the content thereof with respect to the total mass of the piezoelectric polymer material is preferably lower than 1% by mass.

In addition, when the piezoelectric polymer material contains a component other than the helical chiral polymer, the content thereof other than the helical chiral polymer is preferably 20% by mass or lower, and more preferably 10% by mass or lower, with respect to the total mass of the piezoelectric polymer material.

—Crystallization-Promoting Agent (Crystal Nucleating Agent)—

For a crystallization-promoting agent which is not particularly limited if it is seen to have the advantageous effect of promoting crystallization, it is desirable to select a substance having a crystalline structure with an interplanar spacing almost equal to the interplanar spacing of the crystal lattice of the polylactic acid. This is because a substance with a more equal interplanar spacing has a higher advantageous effect.

For example, mention is made of zinc phenylsulfonate, melamine polyphosphate, melamine cyanurate, zinc phenylphosphonate, calcium phenylphosphonate and magnesium phenylphosphonate which are organic substances, and talc and clay which are inorganic substances.

Among them, zinc phenylphosphonate which has an interplanar spacing most similar to that of polylactic acid and provides a good effect of promoting formation of crystals is preferred. As the crystallization-promoting agent used, commercially available one may be used. Specifically, for example, mention is made of zinc phenylphosphonate; Ecopromote (manufactured by Nissan Chemical Industries, Ltd.); and the like.

The content of the crystal nucleating agent is usually from 0.01 to 1.0 part by weight, preferably from 0.01 to 0.5 part by weight, and particularly preferably from 0.02 to 0.2 part by weight from the viewpoint of a better crystal promotion effect and the maintenance of a biomass degree, based on 100 parts by weight of the helical chiral polymer. The crystal promotion effect is not sufficient when the above-described content of the crystal nucleating agent is less than 0.01 part by weight while more than 1.0 part by weight precludes the control of the rate of crystallization to result in a tendency to reduce the transparency of the polymeric piezoelectric material.

The polymeric piezoelectric material preferably contains no components other than the helical chiral polymers from the viewpoint of transparency.

<Production of Polymeric Piezoelectric Material>

The polymeric piezoelectric material in accordance with this embodiment is obtained by mixing a helical chiral polymer such as the previously explained polylactic acid-based polymers with another component as needed to make a mixture.

The mixture is preferably melt-kneaded.

Specifically, for example, when two helical chiral polymers are mixed or a helical chiral polymer is mixed with the above-described inorganic filler or crystal nucleating agent, the helical chiral polymers to be mixed may be melt-kneaded on the conditions of a mixer revolution speed of 30 rpm to 70 rpm and 180° C. to 250° C. for 5 minutes to 20 minutes using a melt-kneading machine [manufactured by Toyo Seiki Seisaku-sho, Ltd.; Labo Plastomill Mixer] to obtain the blend of a plurality of helical chiral polymers or the blend of the helical chiral polymers with other components such as inorganic fillers.

<Methods for Producing Polymeric Piezoelectric Material>

The polymeric piezoelectric material in accordance with this embodiment may be produced, for example, by a production method comprising: the first step of heating a sheet in an amorphous state containing a helical chiral polymer to obtain a preliminarily crystallized sheet; and the second step of stretching the preliminarily crystallized sheet mainly in a uniaxial direction. Specifically, it may be produced in accordance with the method described in Japanese Patent No. 4934235 or International publication No. 2010/104196.

<Physicality of Polymeric Piezoelectric Material>

By virtue of the use of the polymer piezoelectric material of this embodiment, when a pair of end surface electric conductors (electrodes) is formed on end surfaces on both sides in the width direction of the polymer piezoelectric material, the piezoelectric constant $d_{14}$ is not significantly lowered.

[Piezoelectric Constant (Displacement Method)]

In this embodiment, the piezoelectric constant of the polymeric piezoelectric material refers to a value measured as described below.

The polymeric piezoelectric material is cut to a size of 40 mm in a stretching direction (MD direction) and 40 mm in a direction perpendicular to the stretching direction (TD direction), to make a rectangular test piece.

The resultant test piece is set on the test bench of a sputtering thin film deposition system JSP-8000 manufactured by Ulvac, Inc., and a coater chamber is made to be in a vacuum state (for example, $10^{-3}$ Pa or less) by a rotary pump. Thereafter, sputtering treatment of one face of the test piece is performed for 500 seconds on the conditions of an applied voltage of 280 V and a sputtering current 0.4 A) for a Ag (silver) target. Sputtering treatment of the another face of the test piece is then performed on the same conditions for 500 seconds to coat both faces of the test piece with Ag and to form a Ag conductive layer.

The test piece of 40 mm×40 mm on both faces of which the Ag conductive layer is formed is cut at 32 mm in the direction of 45° with respect to the stretching direction (MD direction) of the polymeric piezoelectric material and at 5 mm in the direction perpendicular to the direction of 45° to cut a rectangular film of 32 mm×5 mm. This was used as a sample for measuring a piezoelectric constant.

A difference distance between the maximal and minimum values of the displacement of the film when an alternating voltage of 10 Hz and 300 Vpp was applied to the resultant sample was measured by a laser spectral-interference displacement meter SI-1000 manufactured by Keyence Corporation. A value obtained by dividing a measured displacement (mp–p) by a reference length of the film of 30 mm was used as an amount of deformation, and a value obtained by multiplying a value, obtained by dividing the amount of deformation by an electric field strength ((applied voltage (V))/(film thickness)) applied to the film, by 2, was used as the piezoelectric constant $d_{14}$.

The higher the piezoelectric constant, the greater the displacement of the material based on a voltage applied to the polymeric piezoelectric material and conversely the generated voltage based on force applied to the polymeric piezoelectric material are, so that it is useful as the polymeric piezoelectric material.

Specifically, the piezoelectric constant $d_{14}$ measured by the displacement method at 25° C. is preferably 4 pm/V or more, more preferably 5 pm/V or more, further preferably 6 pm/V or more, and further more preferably 8 pm/V or more.

The upper limit of the piezoelectric constant is not particularly limited but is preferably 50 pm/V or less and more preferably 30 pm/V or less in the piezoelectric material using the helical chiral polymer from the viewpoint of a balance with transparency and the like as described below.

[Crystallinity]

The crystallinity of the polymeric piezoelectric material is determined by the DSC method, and the crystallinity of the polymeric piezoelectric material in accordance with this embodiment is from 20% to 80%, preferably from 50% to 70%. If the crystallinity is in the range, a balance between the piezoelectric characteristic and transparency of the polymeric piezoelectric material is good, and the occurrence of whitening and breaking is inhibited to facilitate its production when the polymeric piezoelectric material is stretched.

[Transparency (Internal Haze)]

The transparency of the polymeric piezoelectric material may be evaluated, for example, by visual observation or haze measurement. In the haze of the polymeric piezoelectric material, the transmission haze for visible light rays is preferably from 0.0% to 50%, more preferably from 0.05% to 30%. As used herein, the haze is a value obtained by measurement in the polymeric piezoelectric material with a thickness of 0.05 mm at 25° C. using a haze measuring machine [manufactured by Tokyo Denshoku Co., Ltd.; TC-HIII DPK] in conformity with JIS-K7105, and the details of the measuring method are described in Examples below. The haze of the polymeric piezoelectric material, which is preferably lower, is preferably from 0.01% to 10%, further preferably from 0.1% to 5%, from the viewpoint of a balance with the piezoelectric constant and the like. "Haze" or "transmission haze" in accordance with the present application refers to the internal haze of the polymeric piezoelectric material according to the present invention. The internal haze is a haze excluding a haze due to the shape of the external surface of the polymeric piezoelectric material as described in Examples below.

<Structure of Piezoelectric Device>

In the piezoelectric device of the present invention, a sum of an area of the electric conductor provided on the principal surface of the polymer piezoelectric material and an area of the electric conductor provided on the opposite surface of the polymer piezoelectric material is represented by D1, and a sum of an area of a portion of the principal surface of the polymer piezoelectric material at which no electric conductor is provided and an area of a portion of the opposite surface of the polymer piezoelectric material at which no electric conductor is provided is represented by D2. At this time, D1/D2 obtained by dividing D1 by D2 is preferably 10 or more. D1/D2 is more preferably 15 or more, still more preferably 17 or more. When D1/D2 is in the range, the shape of the electric conductor and the shape of the area of a portion of the principal surface where no electric conductor is provided are not limited.

In the piezoelectric device of the present invention, a portion corresponding to D2 that is the area of a portion of the polymer piezoelectric material where the electric conductor is provided on only one side, is the range in which a single-sided electrode is provided and is a hardly deformed portion. It is considered that when a ratio of a volume of the portion corresponding to D2 is large, deformation of the polymer piezoelectric material is suppressed. Namely, since the deformation of the polymer piezoelectric material is suppressed near the hardly deformed portion corresponding to D2, it is preferable that D1/D2 is large. When D1/D2 is 10 or more, the deformation of the polymer piezoelectric material is less likely to be suppressed, and the piezoelectric characteristic is high.

Although the electric conductor (electrode) of the piezoelectric device of the present invention is not particularly limited, examples of the electric conductor include ITO, ZnO, IZO (registered trademark), a metal such as aluminum, and conductive polymer. The electric conductor (electrode) provided on the principal surface (particularly, on the surface side) of the polymer piezoelectric material is preferably an electric conductor having transparency. The fact that the electric conductor has transparency specifically means that the internal haze is 20% or less (total light transmittance is 80% or more).

In the piezoelectric device 10 of this embodiment, when the first end surface electric conductor 30 and the second end surface electric conductor 32 are formed on the end surfaces on both sides in the width direction of the first polymer piezoelectric material 12, the piezoelectric constant $d_{14}$ is not significantly lowered.

<Adhesive Forming Adhesive Layer>

Although not illustrated, the back surface 12D of the first polymer piezoelectric material 12 and the first electric conductor 14 may be bonded via an adhesive layer, and the front surface 12C of the first polymer piezoelectric material 12 and the second electric conductor 16 may be bonded via an adhesive layer. Examples of the adhesive forming the adhesive layer (this also applies to an adhesive layer 18 of FIG. 2 and adhesive layers 18 and 24 of FIG. 3) include an acrylic resin, an urethane resin, a cellulosic adhesive, a vinyl acetate resin, an ethylene-vinyl acetate resin, an epoxy resin, a nylon epoxy-based adhesive, a vinyl chloride resin, a chloroprene rubber adhesive, a cyanoacrylate adhesive, a silicone-based adhesive, a modified silicone-based adhesive, an aqueous polymer-isocyanate based adhesive, a styrene-butadiene rubber-based adhesive, a nitrile rubber-based adhesive, an acetal resin, a phenolic resin, a polyamide resin, a polyimid resin, a melamine resin, a urea resin, a bromine resin, a starch-based adhesive, a polyester resin, and a polyolefin resin.

The same material having both functions of the electric conductor and the adhesive layer may be used in the electric conductor and the adhesive layer. Examples of the conductive adhesive include a thermosetting resin and a thermoplastic resin dispersed with an electroconductive filler and a thermosetting resin and a thermoplastic resin dispersed with electroconductive polymer.

Examples of the electroconductive filler include carbon fiber, carbon nanofiber, carbon black, multiwall carbon nanotube, single-wall carbon nanotube, a carbon compound such as fullerene, metal such as gold, silver, copper, and aluminum, and metal oxide such as silicon oxide, titanium oxide, zirconium oxide, and ITO.

Examples of electroconductive polymer include polyaniline, polypyrrole, and polythiophene (or polythiophene doped with polystyrene sulfonate).

[Measurement of Dynamic Viscoelasticity and Loss Tangent of Adhesive]

A method of measuring dynamic viscoelasticity and loss tangent of an adhesive is different between an adhesive which can be made into a self-standing film at 25° C. after being dried (adhesive in a solid state at 25° C.) and an adhesive which cannot be made into a self-standing film at 25° C. (adhesive in an almost liquid state at 25° C.).

In the adhesive which can be made into a self-standing film at 25° C. after being dried, an adhesive is coated onto a Teflon (registered trademark) film, and another Teflon (registered trademark) film is further superposed thereon. After that, the layered body is pressed for 30 minutes by a pressing machine set to 80° C. and then dried, whereby an adhesive film is obtained. The obtained film is cut out into a size of 5 mm×30 mm, and the dynamic solid viscoelasticity (tensile mode) is measured by using a measuring device (RSA2 manufactured by Rheometrics, Inc) under conditions of a measurement temperature of 25° C. and a measurement frequency of 0.01 Hz, and a tensile storage elastic modulus E' (Pa) and the loss tangent are obtained.

In the adhesive which cannot be made into a self-standing film at 25° C. after being dried, that is, in the adhesive in an almost liquid state at 25° C., after an adhesive is coated onto a measuring tool, the adhesive is dried for 30 minutes in an oven set to 80° C., and an adhesive layer is formed on the measuring tool. The dynamic solid viscoelasticity (shear mode) of the adhesive layer is measured by using a measuring device (ARES manufactured by TA Instruments) under conditions of a measurement temperature of 25° C. and a measurement frequency of 0.01 Hz, and a shear storage elastic modulus G' (Pa) and the loss tangent are obtained.

In the measurement of the dynamic solid viscoelasticity, the storage elastic modulus E' or G' (Pa) corresponding to elasticity, a loss elastic modulus E" or G" (Pa) corresponding to viscosity, and a ratio of the loss elastic modulus E" or G" (Pa) to the storage elastic modulus E' or G', that is, the loss tangent (tan δ) reflecting vibration absorption properties are measured.

When the shear storage elastic modulus G' is obtained from dynamic solid viscoelasticity measurement, the shear storage elastic modulus G' can be converted into E' that is a value three times the shear storage elastic modulus G', by using a formula "E'=G'×3".

When the tensile storage elastic modulus E' of an adhesive layer obtained from the dynamic solid viscoelasticity measurement at 25° C. as measured at a frequency of 0.01 Hz (when the shear storage elastic modulus G' is obtained, the value "G'×3" that is three times the shear storage elastic modulus G') is preferably from $1\times10^2$ to $1\times10^9$ Pa, more preferably from $1\times10^3$ to $1\times10^8$ Pa, still more preferably from $1\times10^4$ to $1\times10^7$ Pa. When the tensile storage elastic modulus E' is $1\times10^2$ Pa or more, resistance of a layered film against physical force increases (the film is less likely to be broken). When the tensile storage elastic modulus E' is $1\times10^9$ Pa or less, a piezoelectric device is easily displaced, and the piezoelectricity is high. In other words, when the tensile storage elastic modulus E' is less than $1\times10^2$ Pa, the resistance of the layered film against the physical force may be insufficient, and when the tensile storage elastic modulus E' is more than $1\times10^9$ Pa, the piezoelectric device is less likely to be displaced.

It is preferable that the tensile storage elastic modulus E' of an adhesive layer obtained from the dynamic solid viscoelasticity measurement at 25° C. as measured at a frequency of 0.01 Hz is $1\times10^6$ Pa or more, and the loss tangent is 0.3 or more. An amount of displacement of the piezoelectric device to be measured is an amount of displacement in a direction perpendicular to a thickness direction of a polymer piezoelectric material. Since the adhesive layer exists in the thickness direction of the polymer piezoelectric material, the adhesive layer does not serve to transmit displacement with respect to the amount of displacement to be measured. As with the portion where the electric conductor of the piezoelectric device is not formed (the area is D2), it is important whether the adhesive layer suppresses the displacement of the polymer piezoelectric material. Namely, it is preferable to use an adhesive having a low tensile storage elastic modulus E' (for example, $1\times10^5$ Pa or less) or an adhesive which has a large loss tangent even if the tensile storage elastic modulus E' is high and can follow the displacement of the polymer piezoelectric material. In an adhesive having a high tensile storage elastic modulus E' (for example, $1\times10^6$ Pa or more), the loss tangent is preferably 0.03 or more, more preferably 0.08 or more, still more preferably 0.40 or more.

[Thickness of Adhesive Layer in Layered Film]

Thickness of an adhesive layer in a layered film constituting a piezoelectric device is calculated in accordance with the following formula:

Thickness of adhesive layer=thickness of layered film−sum of film thicknesses before coating adhesive, where the sum of film thicknesses before coating an adhesive is a sum of thicknesses of respective single films before coating the adhesive. When a polymer piezoelectric material is constituted of a single layer film, the sum of film thicknesses before coating an adhesive is thickness of a single polymer piezoelectric material.

In order to suppress the suppression of the displacement of the polymer piezoelectric material, it is considered that it is preferable that the thickness of the adhesive layer is as small as possible; however, a preferred thickness of the adhesive layer is different depending on a tensile storage elastic modulus E' or a value G'×3 that is three times the shear storage elastic modulus G' or a loss tangent.

As described above, in the piezoelectric device according to the present invention, the polymer piezoelectric material having a large piezoelectric constant $d_{14}$ and excellent transparency is used. Thus, the piezoelectric device can be used in various fields such as speakers, headphones, microphones, underwater microphones, ultrasonic wave transducers, ultrasonic wave applied measuring instruments, piezoelectric vibrators, mechanical filters, piezoelectric transformers, delay devices, sensors, acceleration sensors, impact sensors, vibration sensors, pressure-sensitive sensors, tactile sensors, electric field sensors, sound pressure sensors, displays, fans, pumps, variable focus mirrors, noise insulating materials, sound insulating materials, keyboards, audio devices, information process machines, measurement apparatuses, and medical apparatuses.

In the piezoelectric device according to the present invention, when a pair of end surface electric conductors (electrodes) is formed on an end surface on each side in the width direction of the polymer piezoelectric material, the piezoelectric constant $d_{14}$ is not significantly lowered. Thus, the piezoelectric device can be applied to the above-described various piezoelectric devices such as speakers and touch panels. In particular, in the piezoelectric device according to the present invention, when a lead wire is connected to an end surface electrode, the lead wire is not disposed on the principal surface of the piezoelectric device, and therefore, the piezoelectric device is suited for use requiring transparency in a principal surface direction of the piezoelectric device. More specifically, a piezoelectric device provided with an electric conductor (electrode) having transparency is suited for use in speakers, touch panels, actuators, and so on.

Second Exemplary Embodiment

Next, the second exemplary embodiment of a piezoelectric device according to the invention will be described. The same component portions as in the first exemplary embodiment are denoted by the same reference numerals, and thus description thereof will be omitted.

Figure 2:
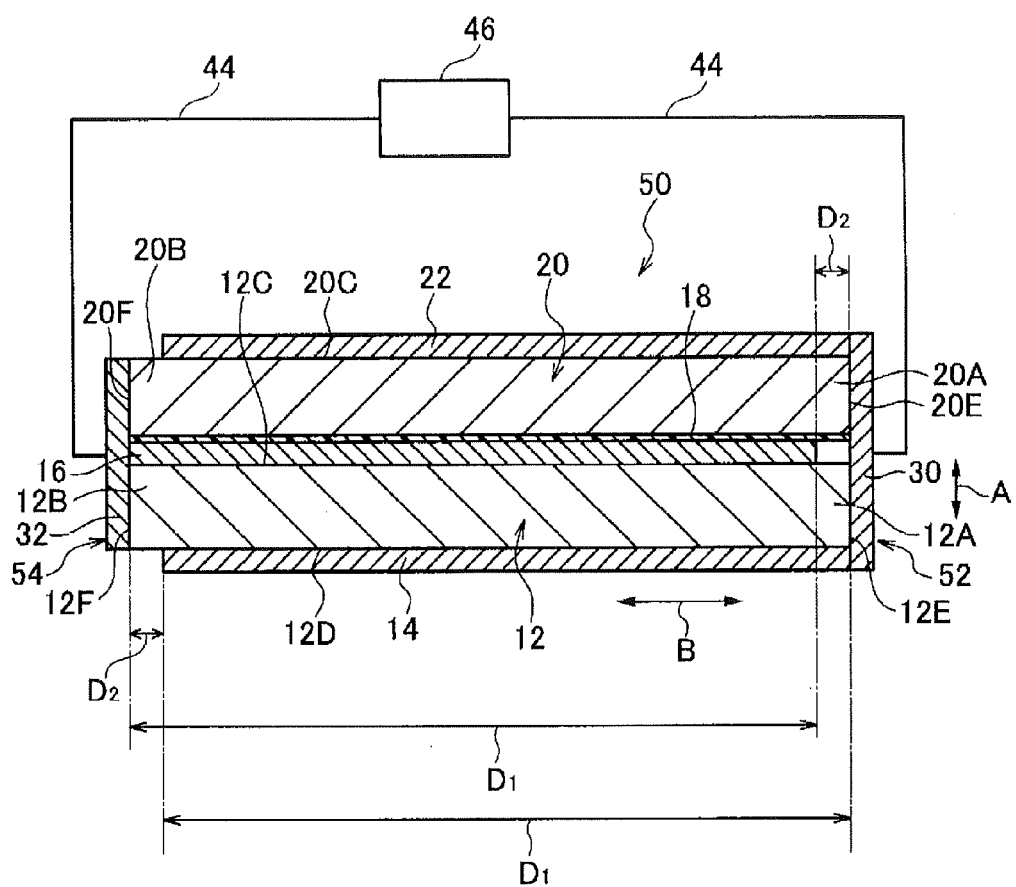
FIG. 2 is a cross-sectional view showing a piezoelectric device of a second exemplary embodiment of the invention.

As shown in FIG. 2, a piezoelectric device 50 is provided with a film-like first polymer piezoelectric material (polymer piezoelectric material) 12, a first electric conductor 14 provided on a principal surface of the first polymer piezoelectric material 12 (a back surface 12D in this embodiment), and a second electric conductor 16 provided on a front surface 12C (a surface at an opposite side from the first electric conductor 14) of the first polymer piezoelectric material 12. The piezoelectric device 50 is further provided with a film-like second polymer piezoelectric material (another polymer piezoelectric material) 20 adhered onto a surface of the second electric conductor 16 provided on the front surface 12C of the first polymer piezoelectric material 12 via an adhesive layer 18. The piezoelectric device 50 is furthermore provided with a third electric conductor 22 provided in a thickness direction on a front surface 20C (a surface at an opposite side from the adhesive layer 18) of the second polymer piezoelectric material 20.

The piezoelectric device 50 is furthermore provided with a first end surface electric conductor 30 provided continuously to one end surfaces 12E and 20E in the width direction (a direction parallel to a principal surface shown by an arrow B) of the first polymer piezoelectric material 12 and the second polymer piezoelectric material 20. The piezoelectric device 50 is furthermore provided with a second end surface electric conductor 32 provided continuously to the other end surfaces 12F and 20F in the width direction of the first polymer piezoelectric material 12 and the second polymer piezoelectric material 20. The first end surface electric conductor 30 is disposed so as to be in contact with the first electric conductor 14 and the third electric conductor 22 and conductively connected to the first electric conductor 14 and the third electric conductor 22 and so as not to be in contact with the second electric conductor 16. The second end surface electric conductor 32 is disposed so as to be in contact with the second electric conductor 16 and conductively connected to the second electric conductor 16 and so as not to be in contact with the first electric conductor 14 or the third electric conductor 22.

In the piezoelectric device 50, one electrode 52 (in this embodiment, a negative electrode, for example) is formed by the first electric conductor 14, the third electric conductor 22, and the first end surface electric conductor 30, and another electrode 54 (in this embodiment, a positive electrode, for example) is formed by the second electric conductor 16 and the second end surface electric conductor 32. The first end surface electric conductor 30 constituting the electrode 52 and the second end surface electric conductor 32 constituting the electrode 54 are connected to an electrical circuit 46 through a lead wire 44.

In the piezoelectric device 50, a sum of an area of an electric conductor provided on the principal surface of the first polymer piezoelectric material 12 (or the second polymer piezoelectric material 20) and an area of an electric conductor provided on the opposite surface of the first polymer piezoelectric material 12 (or the second polymer piezoelectric material 20) is represented by D1. Meanwhile, a sum of an area of a portion of the principal surface of the first polymer piezoelectric material 12 (or the second polymer piezoelectric material 20) at which no electric conductor is provided and an area of a portion of the opposite surface of the first polymer piezoelectric material 12 (or the second polymer piezoelectric material 20) at which no electric conductor is provided is represented by D2. In this case, D1/D2 obtained by dividing D1 by D2 is preferably 10 or more.

In each polymer piezoelectric material in a double-layered structure, D1/D2 is preferably 10 or more. D1/D2 is more preferably 15 or more, still more preferably 17 or more. When D1/D2 is in the range, the shape of the electric conductor and the shape of the area of a portion of the principal surface where no electric conductor is provided are not limited.

In general, in a polymer piezoelectric material constituting a piezoelectric device, when the piezoelectric constant $d_{14}$ is the same, the displacement amount is proportional to the electric field strength. When the same power supply is used, the displacement amount of the polymer piezoelectric material is about twice when the thickness of the polymer piezoelectric material is ½. Thus, when the polymer piezoelectric materials are layered, displacement is large, and the apparent piezoelectric constant $d_{14}$ increases. For example, when the two polymer piezoelectric materials are layered, it is considered that the apparent piezoelectric constant $d_{14}$ ideally approaches about twice.

However, in general, when plural polymer piezoelectric materials are layered, an electric conductor (electrode) is required to be interposed between each of the polymer piezoelectric materials, and therefore, it is difficult to efficiently dispose the electrode and efficiently connect wiring to the electrode.

According to the above constitution of the piezoelectric device 50, when the first end surface electric conductor 30 and the second end surface electric conductor 32 are formed on the end surfaces on both sides in the width direction of a layered film including the first polymer piezoelectric material 12 and the second polymer piezoelectric material 20, the piezoelectric constant $d_{14}$ is not significantly lowered. Since the piezoelectric constant $d_{14}$ is not significantly lowered when the first end surface electric conductor 30 and the second end surface electric conductor 32 are formed on the end surfaces of the layered film, even if the piezoelectric materials are layered, voltage can be applied efficiently, or current can be taken out efficiently.

<Process for Producing Piezoelectric Device 50>

A second exemplary embodiment of a process for producing the piezoelectric device 50 according to the invention will be described.

The third electric conductor 22 is provided on the front surface 20C of the second polymer piezoelectric material 20, except for at the end part 20B at the other side in the width direction. While a portion of the front surface of the end part 20B side of the second polymer piezoelectric material 20 is masked, for example, the third electric conductor 22 is formed by metal vapor deposition or formed of an electroconductive polymer. The third electric conductor 22 may be adhered to the front surface of the second polymer piezoelectric material 20 via an adhesive layer consisting of an adhesive.

The second electric conductor 16 is provided on the front surface 12C of the first polymer piezoelectric material 12, except for at the end part 12A at the one side in the width direction. The second electric conductor 16 is formed by a method similar to that for the third electric conductor 22. The second electric conductor 16 may be adhered to the front surface of the first polymer piezoelectric material 12 via an adhesive layer consisting of an adhesive.

The first electric conductor 14 is provided on the back surface 12D of the first polymer piezoelectric material 12, except for at the end part 12B at the other side in the width direction. The first electric conductor 14 is formed by a method similar to that for the second electric conductor 16.

After that, an adhesive used for forming the adhesive layer 18 is coated onto the back surface of the second polymer piezoelectric material 20, and the second electric conductor 16 on the front surface 12C of the first polymer piezoelectric material 12 is applied onto the adhesive layer 18.

The first end surface electric conductor 30 is formed along the thickness direction on the one end surfaces 12E and 20E sides in the width direction of a layered film including the first polymer piezoelectric material 12, the second polymer piezoelectric material 20, and so on. The first end surface electric conductor 30 is formed so as to be in contact with the first electric conductor 14 and the third electric conductor 22 and so as not to be in contact with the second electric conductor 16.

The second end surface electric conductor 32 is formed along the thickness direction on the other end surfaces 12F and 20F sides in the width direction of the layered film including the first polymer piezoelectric material 12, the second polymer piezoelectric material 20, and so on. The second end surface electric conductor 32 is formed so as to be in contact with the second electric conductor 16 and so as not to be in contact with the first electric conductor 14 or the third electric conductor 22.

The first end surface electric conductor 30 and the second end surface electric conductor 32 are formed by coating a conductive paste onto the end surfaces of the layered film including the first polymer piezoelectric material 12, the second polymer piezoelectric material 20, and so on.

According to the process for producing the piezoelectric device 50, when the first end surface electric conductor 30 and the second end surface electric conductor 32 are formed on the end surfaces on both sides in the width direction of the layered film including the first polymer piezoelectric material 12, the second polymer piezoelectric material 20, and so on, the piezoelectric constant $d_{14}$ is not significantly lowered. Since the piezoelectric constant $d_{14}$ is not significantly lowered when the first end surface electric conductor 30 and the second end surface electric conductor 32 are formed on the end surfaces of the layered film, even if the polymer piezoelectric materials are layered, voltage can be applied efficiently, or current can be taken out efficiently.

Third Exemplary Embodiment

Next, the third exemplary embodiment of a piezoelectric device according to the invention will be described. The same component portions as in the first and second exemplary embodiments are denoted by the same reference numerals, and thus description thereof will be omitted.

<Configuration of Piezoelectric Device 100>

Figure 3:
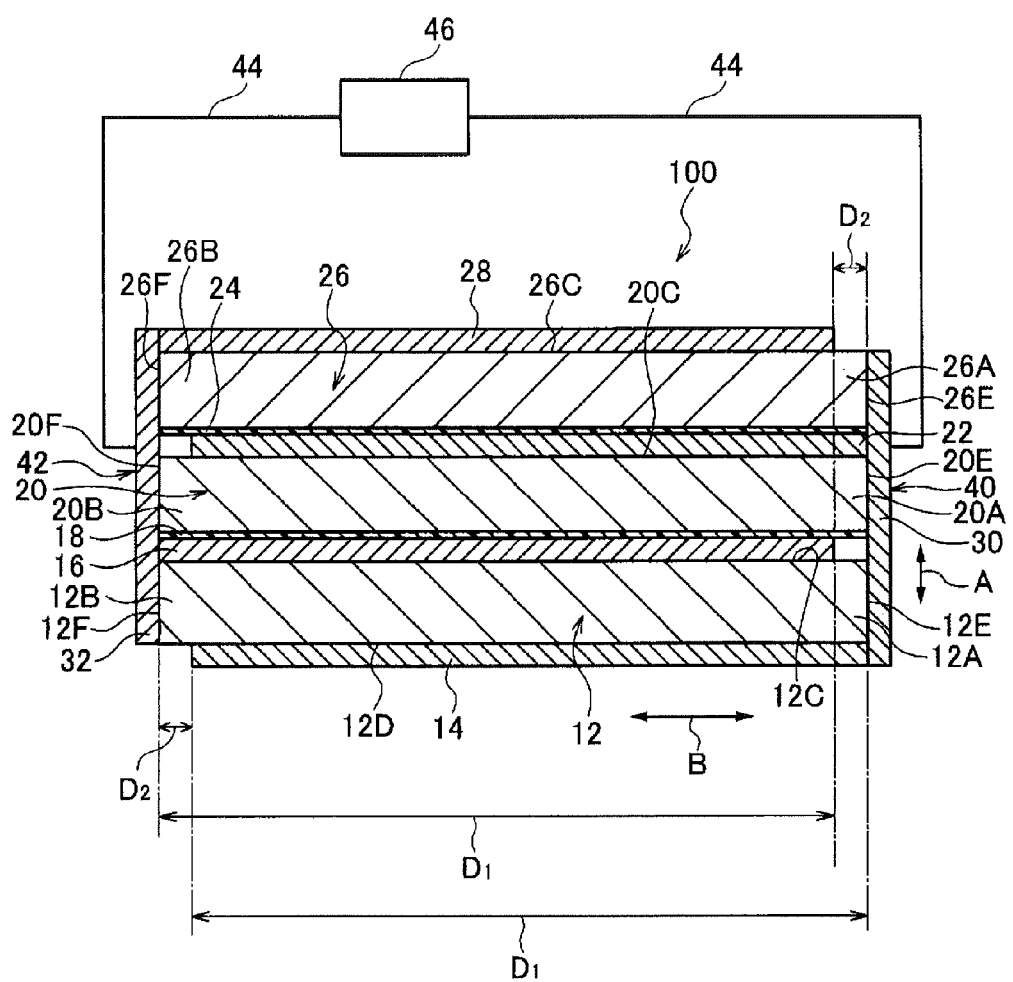
FIG. 3 is a cross-sectional view showing a piezoelectric device of a third exemplary embodiment of the invention.
Figure 4:
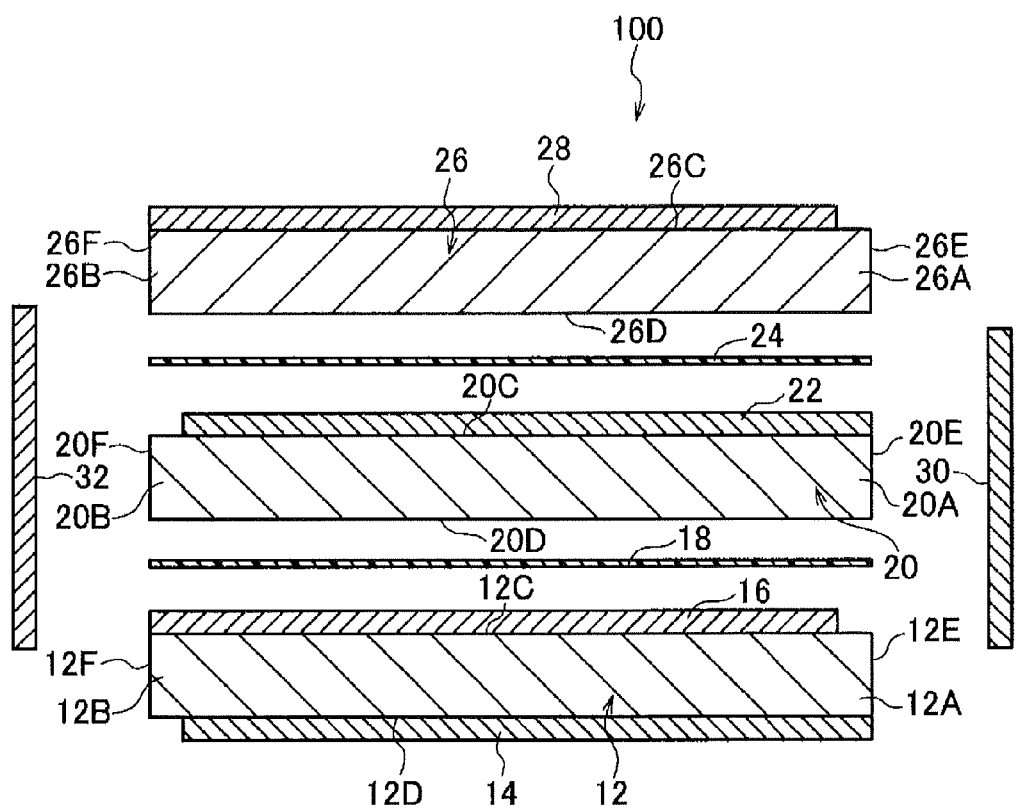
FIG. 4 is an exploded configuration diagram of the piezoelectric device shown in FIG. 3.

FIG. 3 shows a cross-sectional view of a piezoelectric device 100 of the third exemplary embodiment. FIG. 4 shows an exploded configuration diagram of the piezoelectric device 100 of the third exemplary embodiment.

As shown in FIGS. 3 and 4, the piezoelectric device 100 is provided with a first polymer piezoelectric material 12 as an example of a film-like polymer piezoelectric material, a first electric conductor 14 provided on a principal surface of the first polymer piezoelectric material 12 (a back surface 12D in this embodiment) in the thickness direction, and a second electric conductor 16 provided on a front surface 12C (a surface at an opposite side from the first electric conductor 14) of the first polymer piezoelectric material 12 in the thickness direction. The piezoelectric device 100 is further provided with a film-like second polymer piezoelectric material (another polymer piezoelectric material) 20 adhered onto a surface of the second electric conductor 16 provided on the front surface 12C of the first polymer piezoelectric material 12 via an adhesive layer 18. The piezoelectric device 100 is furthermore provided with a third electric conductor 22 provided on a front surface 20C (a surface at an opposite side from the adhesive layer 18) of the second polymer piezoelectric material 20 in a thickness direction.

The piezoelectric device 100 is furthermore provided with a film-like third polymer piezoelectric material 26 adhered onto a surface of the third electric conductor 22 provided on the front surface 20C of the second polymer piezoelectric material 20 via an adhesive layer 24. The piezoelectric device 100 is furthermore provided with a fourth electric conductor 28 provided on a front surface 26C (a surface at an opposite side from the adhesive layer 24) of the third polymer piezoelectric material 26 in the thickness direction.

Namely, in the piezoelectric device 100, the first electric conductor 14, the first polymer piezoelectric material 12, the second electric conductor 16, the adhesive layer 18, the second polymer piezoelectric material 20, the third electric conductor 22, the adhesive layer 24, the third polymer piezoelectric material 26, and the fourth electric conductor 28 are sequentially layered in a direction (thickness direction shown by an arrow A) perpendicular to the back surface 12D (principal surface) of the first polymer piezoelectric material 12. The piezoelectric device 100 has a three-layered structure including the first polymer piezoelectric material 12, the second polymer piezoelectric material 20, and the third polymer piezoelectric material 26.

Figure 7A:
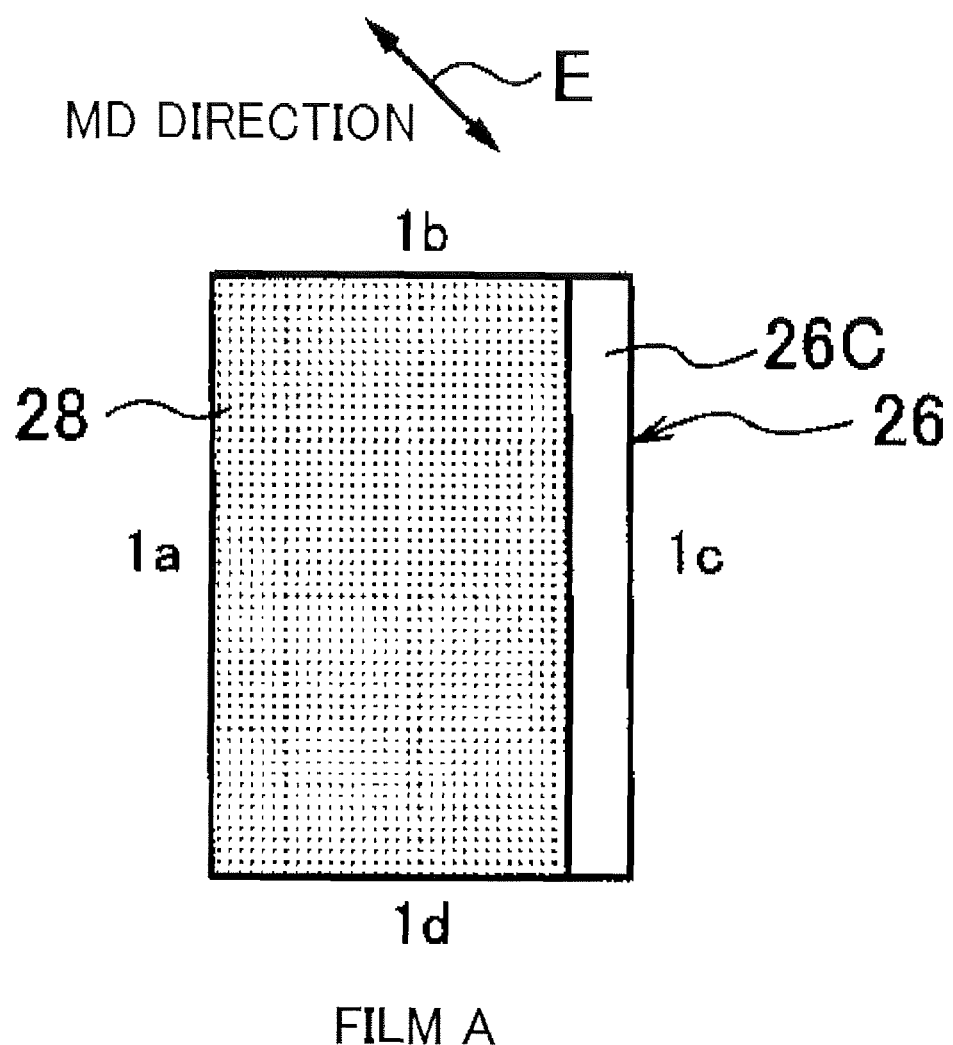
FIG. 7A is a view showing a front surface of a third polymer piezoelectric material (film A) used in the piezoelectric device of the first exemplary embodiment of the present invention.
Figure 7C:
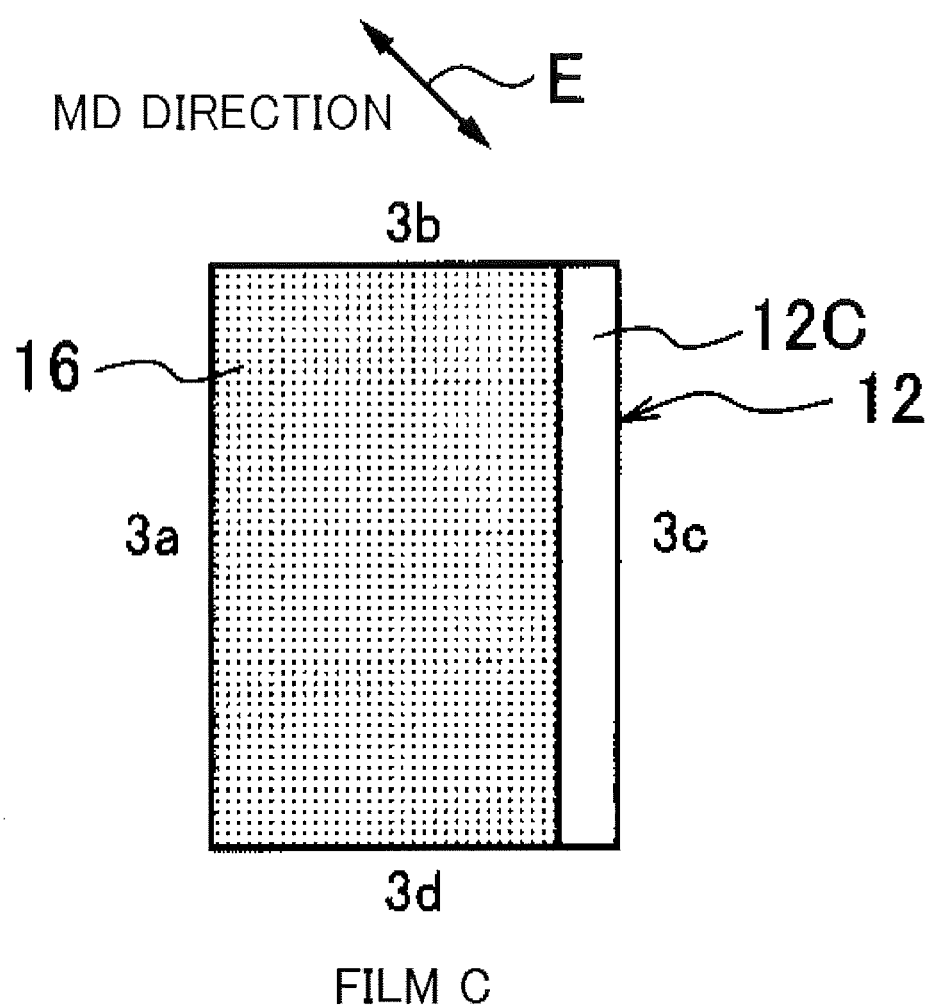
FIG. 7C is a view showing a front surface of a first polymer piezoelectric material (film C) used in the piezoelectric device of the first exemplary embodiment of the invention.

The first polymer piezoelectric material 12, the second polymer piezoelectric material 20, and the third polymer piezoelectric material 26 are each formed into a substantially rectangular shape in plan view (see, FIGS. 7A, 7B, and 7C). The second electric conductor 16 is not formed on the front surface 12C along the one end part 12A in the width direction (a direction parallel to the principal surface shown by an arrow B) of the first polymer piezoelectric material 12 (see, FIG. 7C). The second electric conductor 16 is formed on the other front surface 12C of the first polymer piezoelectric material 12, that is, the front surface 12C including the end part 12B at the other side in the with direction of the first polymer piezoelectric material 12. The first electric conductor 14 is not formed on the back surface 12D following the end part 12B at the other side in the direction of the first polymer piezoelectric material 12 (see, FIG. 8C). The first electric conductor 14 is formed on the other back surface 12D of the first polymer piezoelectric material 12, that is, the back surface 12D including the end part 12A at the one side in the with direction of the first polymer piezoelectric material 12.

The third electric conductor 22 is not formed on the front surface 20C following the end part 20B at the other side in the width direction of the second polymer piezoelectric material 20 (see, FIG. 7B). The third electric conductor 22 is formed on the other front surface 20C of the second polymer piezoelectric material 20, that is, the front surface 20C including the end part 20A at the one side in the width direction of the second polymer piezoelectric material 20.

The fourth electric conductor 28 is not formed on the front surface 26C following the end part 26A at the one side in the width direction of the third polymer piezoelectric material 26 (see, FIG. 7A). The fourth electric conductor 28 is formed on the other front surface 26C of the third polymer piezoelectric material 26, that is, the front surface 26C including the end part 26B at the other side in the width direction of the third polymer piezoelectric material 26.

As shown in FIG. 3, the piezoelectric device 100 is provided with the first end surface electric conductor 30 provided continuously to the one end surfaces 12E, 20E, and 26E in the width direction (a direction parallel to the principal surface shown by the arrow B) of the first polymer piezoelectric material 12, the second polymer piezoelectric material 20, and the third polymer piezoelectric material 26. The piezoelectric device 100 is furthermore provided with a second end surface electric conductor 32 provided continuously to the other end surfaces 12F, 20F, and 26F in the width direction of the first polymer piezoelectric material 12, the second polymer piezoelectric material 20, and the third polymer piezoelectric material 26. The first end surface electric conductor 30 is disposed so as to be in contact with the first electric conductor 14 and the third electric conductor 22 and conductively connected to the first electric conductor 14 and the third electric conductor 22 and not to be in contact with the second electric conductor 16 or the fourth electric conductor 28. The second end surface electric conductor 32 is disposed so as to be in contact with the second electric conductor 16 and the fourth electric conductor 28 and conductively connected to the second electric conductor 16 and the fourth electric conductor 28 and not to be in contact with the first electric conductor 14 or the third electric conductor 22.

In the piezoelectric device 100, one electrode 40 (in this embodiment, a negative electrode, for example) is formed by the first electric conductor 14, the third electric conductor 22, and the first end surface electric conductor 30, and another electrode 42 (in this embodiment, a positive electrode, for example) is formed by the second electric conductor 16, the fourth electric conductor 28, and the second end surface electric conductor 32. The first end surface electric conductor 30 constituting the electrode 40 and the second end surface electric conductor 32 constituting the electrode 42 are connected to an electrical circuit 46 through a lead wire 44. The electrical circuit 46 applies a predetermined voltage to the electrodes 40 and 42 and thereby deforms the first polymer piezoelectric material 12, the second polymer piezoelectric material 20, and the third polymer piezoelectric material 26 mainly in a direction perpendicular to the thickness direction.

As shown in FIG. 3, in the piezoelectric device 100, a sum of an area of an electric conductor provided on the principal surface of the first polymer piezoelectric material 12 (or the second polymer piezoelectric material 20, or the third polymer piezoelectric material 26) and an area of an electric conductor provided on the opposite surface of the first polymer piezoelectric material 12 (or the second polymer piezoelectric material 20, or the third polymer piezoelectric material 26) is represented by D1. Meanwhile, a sum of an area of a portion of the principal surface of the first polymer piezoelectric material 12 (or the second polymer piezoelectric material 20, or the third polymer piezoelectric material 26) at which no electric conductor is provided and an area of a portion of the opposite surface of the first polymer piezoelectric material 12 (or the second polymer piezoelectric material 20, or the third polymer piezoelectric material 26) at which no electric conductor is provided is represented by D2. In this case, D1/D2 obtained by dividing D1 by D2 is preferably 10 or more.

In each polymer piezoelectric material in a three-layered structure, D1/D2 is preferably 10 or more. D1/D2 is more preferably 15 or more, still more preferably 17 or more. When D1/D2 is in the range, the shape of the electric conductor and the shape of the area of a portion of the principal surface where no electric conductor is provided are not limited.

The first polymer piezoelectric material 12, the second polymer piezoelectric material 20, and the third polymer piezoelectric material 26 are configured to include a helical chiral polymer having a weight average molecular weight of from 50,000 to 1,000,000 and having optical activity, and the degree of crystallinity of the polymer piezoelectric material as obtained by a DSC method is from 20% to 80%.

According to the above constitution of the piezoelectric device 100, when the first end surface electric conductor 30 and the second end surface electric conductor 32 are formed on the end surfaces on both sides in the width direction of a layered film including the first polymer piezoelectric material 12, the second polymer piezoelectric material 20, and the third polymer piezoelectric material 26, each piezoelectric constant $d_{14}$ of the first polymer piezoelectric material 12, the second polymer piezoelectric material 20, and the third polymer piezoelectric material 26 is not significantly lowered. Since the piezoelectric constant $d_{14}$ is not significantly lowered when the first end surface electric conductor 30 and the second end surface electric conductor 32 are formed on the end surfaces of the layered film, even if the first polymer piezoelectric material 12, the second polymer piezoelectric material 20, and the third polymer piezoelectric material 26 are layered, voltage can be applied efficiently, or current can be taken out efficiently.

<Process for Producing Piezoelectric Device 100>

A third exemplary embodiment of a process for producing a piezoelectric device will be described.

FIGS. 7A to 7C and 8A to 8C show the third exemplary embodiment of the process for producing the piezoelectric device 100.

As shown in FIG. 7A, the film-like third polymer piezoelectric material 26 is formed into a rectangular shape in plan view (as viewed from the front surface 26C of the third polymer piezoelectric material 26). Namely, the third polymer piezoelectric material 26 is provided with a pair of long sides 1a and 1c arranged to face each other and a pair of short sides 1b and 1d substantially perpendicular to the long sides 1a and 1c. The long side 1a of the third polymer piezoelectric material 26 is disposed in a direction forming an angle of about 45° on the lower side in the drawing with respect to a uniaxial stretching direction E (MD direction) of the third polymer piezoelectric material 26, for example. The uniaxial stretching direction E (MD direction) of the third polymer piezoelectric material 26 is not limited to the present embodiment, the uniaxial stretching direction E can be changed.

Figure 8A:
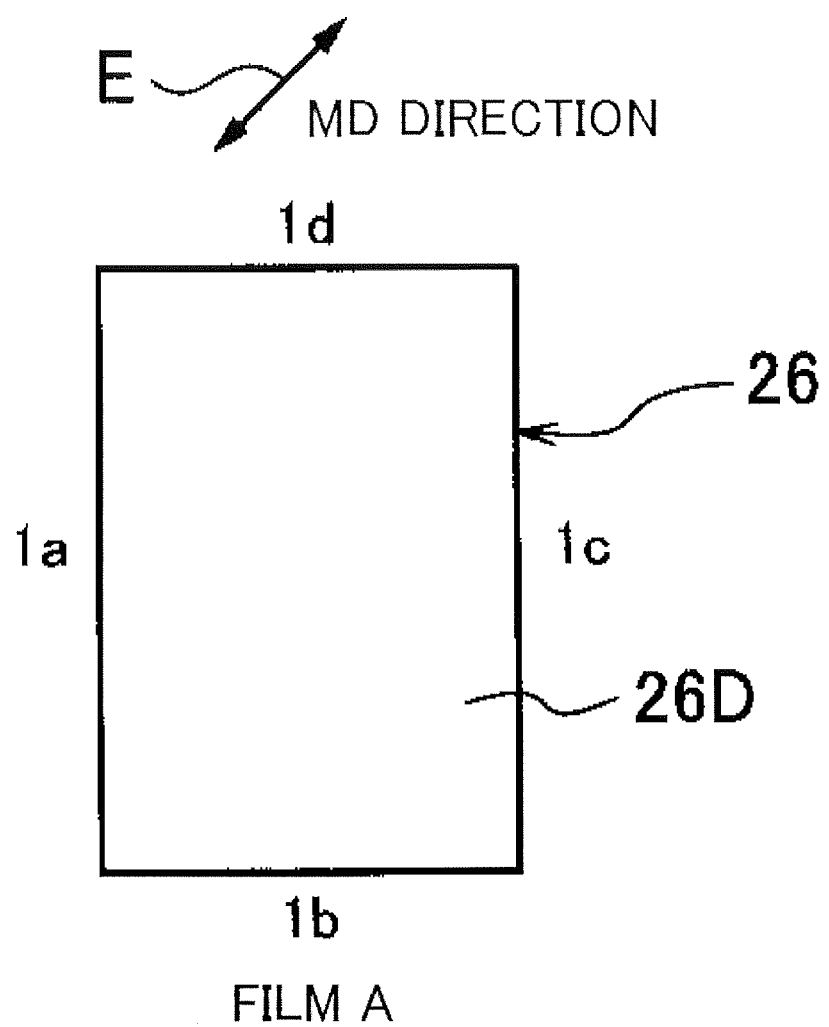
FIG. 8A is a view showing a back surface of the third polymer piezoelectric material (film A) used in the piezoelectric device of the first exemplary embodiment of the invention.

The fourth electric conductor 28 is provided on the front surface 26C of the third polymer piezoelectric material 26, except for at the end part on the long side 1c at the one side in the width direction. While an end part of the long side 1c side of the front surface 26C of the third polymer piezoelectric material 26 is masked, for example, the fourth electric conductor 28 is formed by metal vapor deposition or formed of an electroconductive polymer. The fourth electric conductor 28 may be adhered to the front surface 26C of the third polymer piezoelectric material 26 via an adhesive layer consisting of an adhesive. As shown in FIG. 8A, no electric conductor is formed on the back surface 26D of the third polymer piezoelectric material 26.

As shown in FIG. 7B, the film-like second polymer piezoelectric material 20 is formed into a rectangular shape in plan view and provided with long sides 2a and 2c and short sides 2b and 2d. The long side 2a of the second polymer piezoelectric material 20 is disposed in a direction forming an angle of about 45° on the upper side in the drawing with respect to a uniaxial stretching direction F (MD direction) of the second polymer piezoelectric material 20, for example. Namely, the uniaxial stretching direction F (MD direction) of the second polymer piezoelectric material 20 is a direction intersecting (in this embodiment, perpendicularly to) the uniaxial stretching direction E (MD direction) of the third polymer piezoelectric material 26. The uniaxial stretching direction F (MD direction) of the second polymer piezoelectric material 20 is not limited to the present embodiment, the uniaxial stretching direction F can be changed.

Figure 8B:
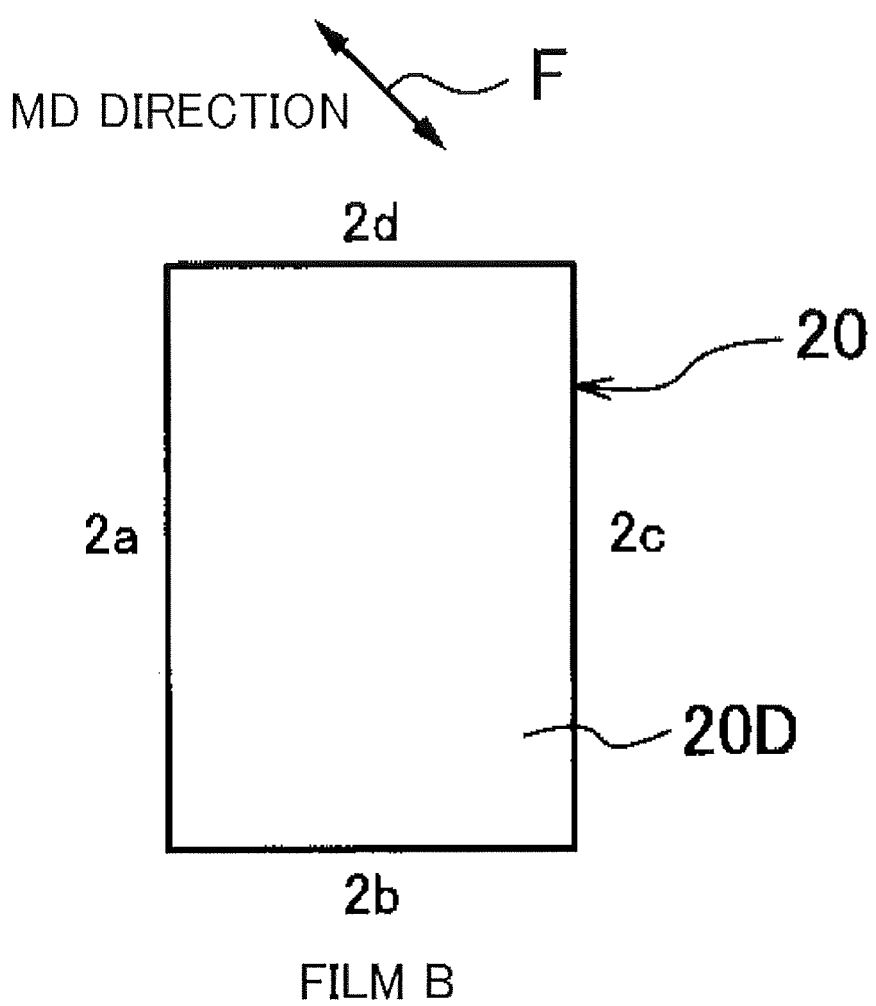
FIG. 8B is a view showing a back surface of the second polymer piezoelectric material (film B) used in the piezoelectric device of the first exemplary embodiment of the invention.

The third electric conductor 22 is provided on the front surface 20C of the second polymer piezoelectric material 20, except for at the end part on the long side 2a at the other side in the width direction. The third electric conductor 22 is formed by a method similar to that for the fourth electric conductor 28. The third electric conductor 22 may be adhered onto the front surface 20C of the second polymer piezoelectric material 20 via an adhesive layer consisting of an adhesive. As shown in FIG. 8B, no electric conductor is formed on the back surface 20D of the second polymer piezoelectric material 20.

As shown in FIG. 7C, the film-like first polymer piezoelectric material 12 is formed into a rectangular shape in plan view and provided with long sides 3a and 3c and short sides 3b and 3d. The long side 3a of the first polymer piezoelectric material 12 is disposed in a direction forming an angle of about 45° on the lower side in the drawing with respect to the uniaxial stretching direction E (MD direction) of the first polymer piezoelectric material 12, for example. The uniaxial stretching direction E (MD direction) of the first polymer piezoelectric material 12 is substantially the same as the uniaxial stretching direction E (MD direction) of the third polymer piezoelectric material 26. The uniaxial stretching direction E (MD direction) of the first polymer piezoelectric material 12 is not limited to the present embodiment, the uniaxial stretching direction E can be changed.

The second electric conductor 16 is provided on the front surface 12C of the first polymer piezoelectric material 12, except for at the end part on the long side 3c side. The second electric conductor 16 is formed by a method similar to that for the fourth electric conductor 28. The second electric conductor 16 may be adhered onto the front surface 12C of the first polymer piezoelectric material 12 via an adhesive layer consisting of an adhesive.

As shown in FIG. 8C, the first electric conductor 14 is provided on the back surface 12D of the first polymer piezoelectric material 12, except for at the end part on the long side 3a side. The first electric conductor 14 is formed by a method similar to that for the second electric conductor 16.

After that, as shown in FIGS. 3 and 4, an adhesive used for forming the adhesive layer 18 is coated onto the back surface 20D of the second polymer piezoelectric material 20, and the second electric conductor 16 on the front surface 12C of the first polymer piezoelectric material 12 is applied onto the adhesive layer 18. At this time, the second electric conductor 16 is applied onto the adhesive layer 18 so that the long sides 3a and 3c and the short sides 3b and 3d are overlapped respectively on the long sides 2a and 2c and the short sides 2b and 2d. An adhesive used for forming the adhesive layer 24 is coated onto the back surface 26D of the third polymer piezoelectric material 26, and the third electric conductor 22 on the front surface 20C of the second polymer piezoelectric material 20 is applied onto the adhesive layer 24. The adhesive forming the adhesive layers 18 and 24 will be described later.

As shown in FIGS. 3 and 4, the first end surface electric conductor 30 is formed along a thickness direction on the one end surfaces 12E, 20E, and 26E (on the long sides 3c, 2c, and 1c sides) in the width direction of a layered film including the first polymer piezoelectric material 12, the second polymer piezoelectric material 20, the third polymer piezoelectric material 26, and so on. The second end surface electric conductor 32 is formed along a thickness direction on the other end surfaces 12F, 20F, and 26F (on the long sides 3a, 2a, and 1a sides) in the width direction of the layered film including the first polymer piezoelectric material 12, the second polymer piezoelectric material 20, the third polymer piezoelectric material 26, and so on. The first end surface electric conductor 30 and the second end surface electric conductor 32 are formed by coating a conductive paste onto the end surfaces of the first polymer piezoelectric material 12, the second polymer piezoelectric material 20, and the third polymer piezoelectric material 26, for example.

According to the process for producing the piezoelectric device 100, when the first end surface electric conductor 30 and the second end surface electric conductor 32 are formed on the end surfaces on both sides in the width direction of the layered film including the first polymer piezoelectric material 12, the second polymer piezoelectric material 20, the third polymer piezoelectric material 26 and so on, each piezoelectric constant $d_{14}$ of the first polymer piezoelectric material 12, the second polymer piezoelectric material 20, the third polymer piezoelectric material 26 is not significantly lowered. Since the piezoelectric constant $d_{14}$ is not significantly lowered when the first end surface electric conductor 30 and the second end surface electric conductor 32 are formed on the end surfaces of the layered film, even if the polymer piezoelectric materials are layered, voltage can be applied efficiently, or current can be taken out efficiently.

In the piezoelectric device 100, when a layer mainly composed of an L-isomer of a helical chiral polymer or a layer mainly composed of a D-isomer of the helical chiral polymer is, for example, used as the polymer piezoelectric material, if the direction of the electric field is reversed, opposite deformation occurs. In the layer mainly composed of the L-isomer of the helical chiral polymer and the layer mainly composed of the D-isomer of the helical chiral polymer, deformation in opposite directions occurs with respect to the electric field. Thus, when the polymer piezoelectric materials are layered, the polymer piezoelectric materials are required to be arranged so that the directions of displacement of the polymer piezoelectric materials are set equal, in consideration of the direction of voltage, the uniaxial stretching direction (MD direction) of the polymer piezoelectric material, and the layer mainly composed of the L-isomer of the helical chiral polymer or the layer mainly composed of the D-isomer of the helical chiral polymer.

Examples of the layer mainly composed of the L-isomer of the helical chiral polymer include a layer mainly composed of a homopolymer of L-lactic acid (PLLA), and examples of the layer mainly composed of the D-isomer of the helical chiral polymer include a layer mainly composed of a homopolymer of D-lactic acid (PDLA).

In the piezoelectric device 100 shown in FIG. 3, the first electric conductor 14 constituting the electrode 40, the first polymer piezoelectric material 12, the second electric conductor 16 constituting the electrode 42, the second polymer piezoelectric material 20, the third electric conductor 22 constituting the electrode 40, the third polymer piezoelectric material 26, and the fourth electric conductor 28 constituting the electrode 42 are arranged in that order. Thus, the direction of voltage of the second polymer piezoelectric material 20 is reversed to the directions of voltages of the first polymer piezoelectric material 12 and the third polymer piezoelectric material 26.

Figure 5:
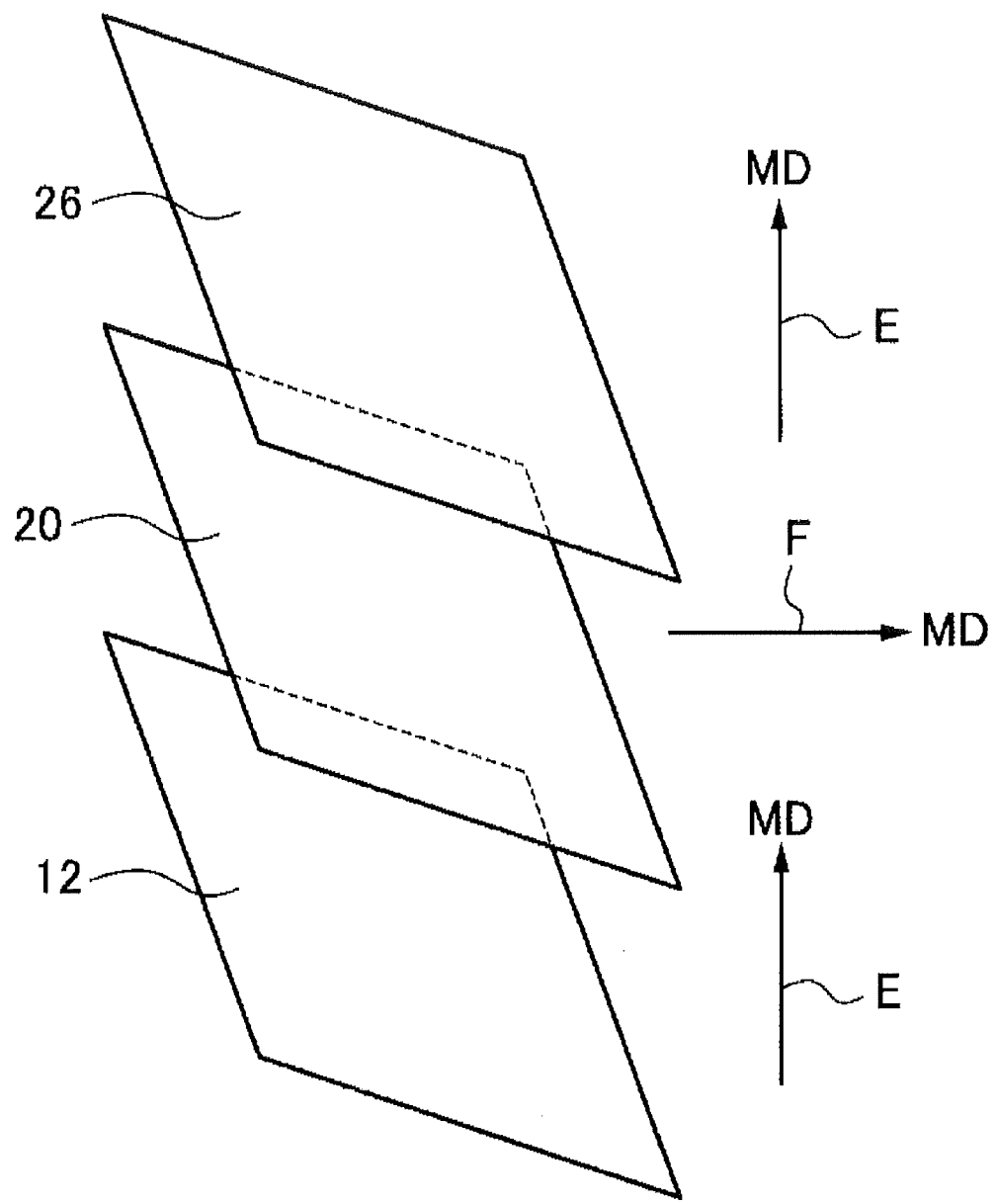
FIG. 5 is a view showing an example in which a polymer piezoelectric material used in the piezoelectric device shown in FIG. 3 is formed from three layers mainly composed of an L-isomer of a helical chiral polymer and is a schematic exploded perspective view showing a uniaxial stretching direction of each polymer piezoelectric material.

For example, as shown in FIG. 5, when the first polymer piezoelectric material 12, the second polymer piezoelectric material 20, and the third polymer piezoelectric material 26 are formed from the layer mainly composed of the L-isomer of the helical chiral polymer, it is preferable to arrange the first polymer piezoelectric material 12, the second polymer piezoelectric material 20, and the third polymer piezoelectric material 26 so that the uniaxial stretching direction F (MD direction) of the second polymer piezoelectric material 20 intersects (in this embodiment, is perpendicular to) the uniaxial stretching directions E (MD direction) of the first polymer piezoelectric material 12 and the third polymer piezoelectric material 26. According to this constitution, the directions of displacement of the first polymer piezoelectric material 12, the second polymer piezoelectric material 20, and the third polymer piezoelectric material 26 can be set equal. The polymer piezoelectric material may include other components as long as it is "the layer mainly composed of the L-isomer of the helical chiral polymer" and may include the L-isomer and the D-isomer. It is preferable that the layer mainly composed of the L-isomer of the helical chiral polymer includes at least 70% or more of the L-isomer of the helical chiral polymer.

For example, as shown in FIG. 6, when the first polymer piezoelectric material 12 and the third polymer piezoelectric material 26 are formed from the layer mainly composed of the L-isomer of the helical chiral polymer, and when the second polymer piezoelectric material 20 is formed from the layer mainly composed of the D-isomer of the helical chiral polymer, it is preferable that the first polymer piezoelectric material 12, the second polymer piezoelectric material 20, and the third polymer piezoelectric material 26 are arranged so that the uniaxial stretching directions E (MD direction) of the first polymer piezoelectric material 12, the second polymer piezoelectric material 20, and the third polymer piezoelectric material 26 are substantially the same. According to this constitution, the directions of the displacement of the first polymer piezoelectric material 12, the second polymer piezoelectric material 20, and the third polymer piezoelectric material 26 can be set equal.

It is preferable that the layer mainly composed of the D-isomer of the helical chiral polymer includes at least 70% or more of the D-isomer of the helical chiral polymer. The polymer piezoelectric material may include other components as long as it is "the layer mainly composed of the L-isomer of the helical chiral polymer" or "the layer mainly composed of the D-isomer of the helical chiral polymer" and may include the L-isomer and the D-isomer.

Other Embodiments

In the piezoelectric devices of the first to third exemplary embodiments, although the one, two, or three polymer piezoelectric materials are layered, the invention is not limited to the embodiments, and four or more polymer piezoelectric materials may be layered. Namely, the invention is not limited to the embodiments in which one or two polymer piezoelectric materials are layered and is applicable even if three or more polymer piezoelectric materials are layered as long as the configuration of the invention is provided.

In a structure in which four or more polymer piezoelectric materials are layered, it is preferable to provide a layered film in which an electric conductor is interposed between each of the principal surface sides of the polymer piezoelectric materials. It is preferable that the plural electric conductors arranged in the thickness direction between the polymer piezoelectric materials are conductively connected alternately to the first end surface electric conductor (one electrode) and the second end surface electric conductor (the other electrode). Consequently, even when four or more polymer piezoelectric materials are layered, electrodes can be arranged efficiently.

Figure 9:
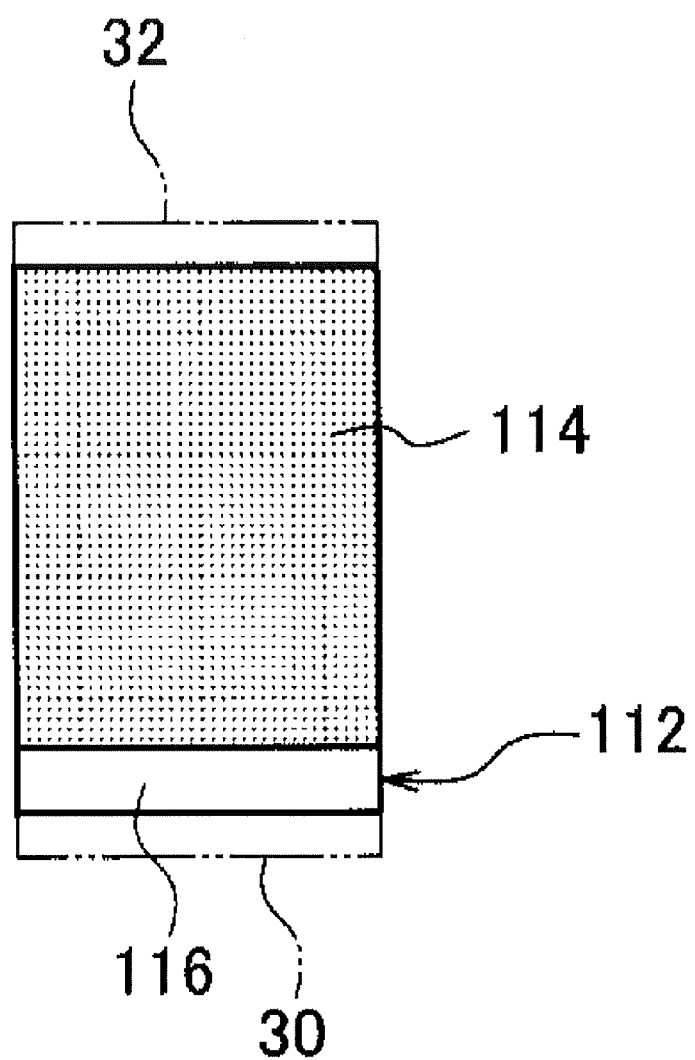
FIG. 9 is a plan view showing a schematic configuration of a piezoelectric device of a fourth exemplary embodiment of the invention.

In the piezoelectric devices of the first to third exemplary embodiments, although the portion at which no electric conductor is provided is provided along the longitudinal direction at the end part of the principal surface of the rectangular polymer piezoelectric material, the invention is not limited thereto. For example, as shown in FIG. 9, a portion 116 at which an electric conductor 114 is not provided may be provided along a direction perpendicular to a longitudinal direction at an end part of a principal surface of a rectangular polymer piezoelectric material 112. In this case, it is preferable that a first end surface electric conductor 30 and a second end surface electric conductor 32 are provided on end surfaces on both sides in the longitudinal direction of the polymer piezoelectric material 112, for example.

In the piezoelectric devices of the first to third exemplary embodiments, although the first end surface electric conductor and the second end surface electric conductor are provided on both sides in the direction perpendicular to the longitudinal direction of the rectangular polymer piezoelectric material, the invention is not limited thereto. For example, the first end surface electric conductor or the second end surface electric conductor may be provided on an end surface in the longitudinal direction of the polymer piezoelectric material. Namely, "the width direction" of the polymer piezoelectric material is not limited to the direction perpendicular to the longitudinal direction of the polymer piezoelectric material, and the longitudinal direction of the polymer piezoelectric material is included.

Figure 10:
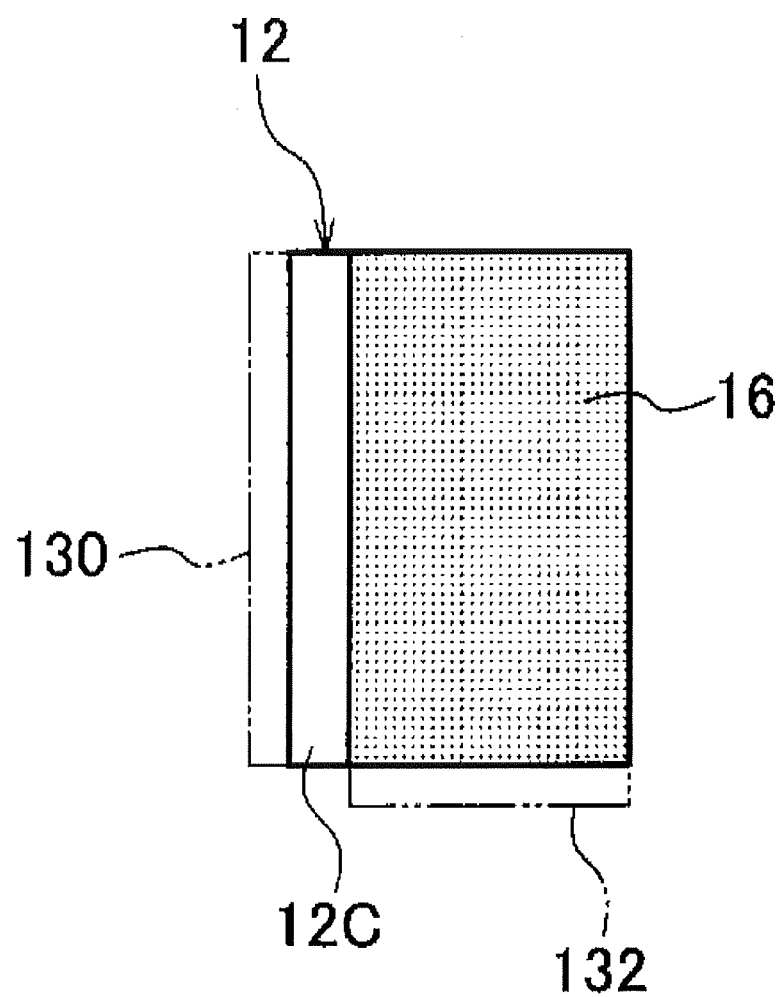
FIG. 10 is a plan view showing a schematic configuration of a piezoelectric device of a fifth exemplary embodiment of the invention.
Figure 11:
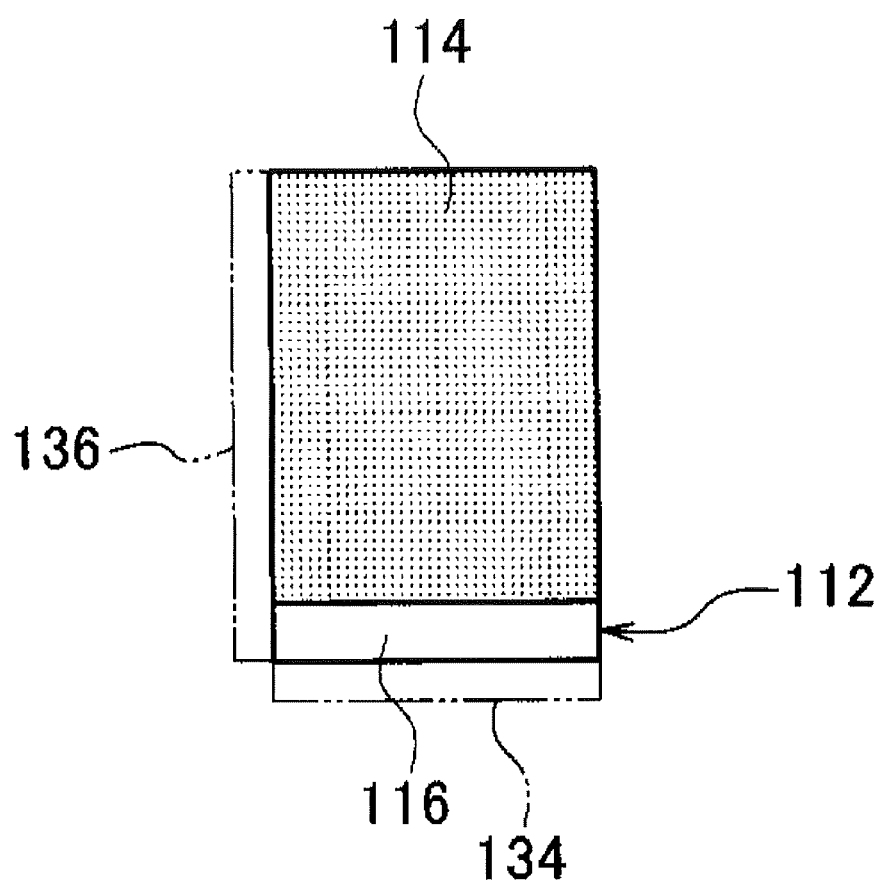
FIG. 11 is a plan view showing a schematic configuration of a piezoelectric device of a sixth exemplary embodiment of the invention.

As shown in FIG. 10, a first end surface electric conductor 130 may be provided on one end surface in the width direction (the direction perpendicular to the longitudinal direction) of the first polymer piezoelectric material 12, and a second end surface electric conductor 132 may be provided on any other end surface (for example, an end surface perpendicular to the one end surface) that is not the one end surface of the first polymer piezoelectric material 12 so as not to be in contact with the first end surface electric conductor 130. Similarly, as shown in FIG. 11, a first end surface electric conductor 134 may be provided on one end surface in the width direction (longitudinal direction) of the polymer piezoelectric material 112, and a second end surface electric conductor 136 may be provided on any other end surface (for example, an end surface perpendicular to the one end surface) that is not the one end surface of the polymer piezoelectric material 112 so as not to be in contact with the first end surface electric conductor 134.

EXAMPLES

The exemplary embodiment of the invention is hereinafter described more specifically by examples and is not limited to the following examples unless it deviates from the spirit thereof.

Production Example 1

A polylactic acid solution is prepared by dissolving 10 g of a polylactic acid resin produced by Mitsui Chemicals, Inc. (registered trademark: LACEA, H-400 (weight-average molecular weight Mw: 200,000) and 200 g of chloroform (produced by Wako Pure Chemical Industries, Ltd., Wako first grade) at room temperature. Next, 1 part by weight of CARBODILITE (Nisshinbo Chemical Inc., LA-1) as a carbodiimide compound which is a stabilizer (B), based on 100 parts by weight of the polylactic acid, and 10 g of chloroform are dissolved at room temperature, and a stabilizer solution is prepared.

The polylactic acid solution and the stabilizer solution were mixed at room temperature and stirred for 30 minutes. The solution was stood for 12 hours at 50° C. and at 0.2 atmospheric pressure and then dried, whereby a mixed solid was obtained. The mixed solid was hot pressed for 1 minute at 205° C. and thereafter pressed by a pressing machine set to 20° C., and a rapidly cooled film was obtained. Two opposed sides of the rapidly cooled film were fixed by a clip, and the film was uniaxially stretched 3.3 times while being heated to 70° C. in a direction (MD direction) perpendicular to the fixed two sides, whereby a stretched film was obtained. The obtained stretched film was annealed at 130° C. for 600 seconds and thereafter rapidly cooled, and a film-like polymer piezoelectric material was obtained.

Example 1

When viewed from a front surface of the film-like polymer piezoelectric material produced in the production example 1, the polymer piezoelectric material was cut into a length of 30 mm in a direction forming an angle of 45° with respect to the uniaxial stretching direction (MD direction) of the polymer piezoelectric material and a length of 40 mm in a direction perpendicular to the direction forming an angle of 45°, and a film with a size of 30 mm in width and 40 mm in length was cut out. At this time, four sides of the film are 1a, 1b, 1c, and 1d, as shown in FIG. 7A. In the film, an end part on the side 1c side with a size of 2 mm in width and 40 mm in length was masked with a Kapton tape (NITTO DENKO CORPORATION., P-221), and a film front surface was deposited with aluminum (electric conductor) by using a deposition apparatus (SHOWA SHINKU CO., LTD., SIP-600), and a film A (corresponding to the third polymer piezoelectric material 26) was produced.

As shown in FIG. 8A, aluminum was not deposited on a back surface of the film A.

When viewed from the front surface of the film-like polymer piezoelectric material produced in the production example 1, the polymer piezoelectric material was cut into a length of 30 mm in the direction perpendicular to the direction forming an angle of 45° with respect to the stretching direction (MD direction) of the polymer piezoelectric material and a length of 40 mm in the direction forming an angle of 45°, and a film with a size of 30 mm in width and 40 mm in length was cut out. At this time, four sides of the film are 2a, 2b, 2c, and 2d, as shown in FIG. 7B. In the film, an end part on the side 2a side with a size of 2 mm in width and 40 mm in length was masked with a Kapton tape, and a film front surface was deposited with aluminum by using a deposition apparatus, and a film B (corresponding to the second polymer piezoelectric material 20) was produced.

As shown in FIG. 8B, aluminum was not deposited on a hack surface of the film B.

When viewed from the front surface of the film-like polymer piezoelectric material produced in the production example 1, the polymer piezoelectric material was cut into a length of 30 mm in the direction forming an angle of 45° with respect to the stretching direction (MD direction) of the polymer piezoelectric material and a length of 40 mm in the direction perpendicular to the direction forming an angle of 45°, and a film with a size of 30 mm in width and 40 mm in length was cut out. At this time, four sides of the film are 3a, 3b, 3c, and 3d, as shown in FIG. 7C. In the film, an end part on the side 3e side with a size of 2 mm in width and 40 mm in length was masked with a Kapton tape, and a film front surface was deposited with aluminum by using a deposition apparatus.

Further, as shown in FIG. 8C, in a back surface of the film, an end part on the side 3a side with a size of 2 mm in width and 40 mm in length was masked with a Kapton tape, and the film back surface was deposited with aluminum by using a deposition apparatus, whereby a film C (corresponding to the first polymer piezoelectric material 12) was produced.

JA-7562 (3M) as an adhesive was coated onto a front surface of the film C at room temperature, and the front surface of the film C was applied onto the back surface of the film B. At this time, the film was applied so that 3a, 3b, 3c, and 3d were overlapped respectively with 2a, 2b, 2c, and 2d. JA-7562 was further coated onto a front surface of the applied film, and the film was applied onto the back surface of the film A. At this time, the film was applied so that 2a, 2b, 2c, and 2d were overlapped respectively with 1a, 1b, 1c, and 1d. The film was pressed for 30 minutes by a pressing machine set to a temperature of 80° C. and then dried. The side 1a side of the film was cut into a width of 1 mm and a length of 40 mm, the side 1c side was cut into a width of 1 mm and a length of 40 mm, the side 1b side was cut into a width of 28 mm and a length of 4 mm, the side 1d side was cut into a width of 28 mm and a length of 4 mm, and a layered film with a size of 28 mm in width and 32 mm in length was obtained. A silver paste (The Nilaco Corporation, Ag-400150) as an end surface electric conductor was coated onto an end surface on the side 1a side and the entire end surface of the side 1e side of the layered film and then dried for 30 minutes at room temperature.

Example 2

A layered film with a size of 18 mm in width and 32 mm in length was obtained in a similar manner to Example 1 except that each width of the film A, the film B, and the film C was 20 mm.

Comparative Example 1

A layered film with a size of 8 mm in width and 32 mm in length was obtained in a similar manner to Example 1 except that each width of the film A, the film B, and the film C was 10 mm.

Example 3

A layered film was produced in a similar manner to Example 1 except that ARABIC YAMATO (YAMATO Co., Ltd.) was used as an adhesive.

Example 4

A layered film was produced in a similar manner to Example 1 except that SK-DYNE 1499 (Soken Chemical Engineering Co., Ltd.) was used as an adhesive.

Comparative Example 2

A layered film was produced in a similar manner to Comparative Example 1 except that the ARABIC YAMATO was used as an adhesive.

Comparative Example 3

A layered film was produced in a similar manner to Comparative Example 1 except that the SK-DYNE 1499 was used as an adhesive.

Comparative Example 4

A layered film was produced in a similar manner to Comparative Example 1 except that EW2050 (3M) was used as an adhesive.

<Measurement and Evaluation of Physicality>

In the layered films in Examples 1 to 4 and Comparative Examples 1 to 4 obtained as described above, D1/D2, the thickness (μm) of an adhesive layer in each layered film, and the piezoelectric constant $d_{14}$ (pm/V) were measured. Further, each storage elastic modulus (Pa) and loss tangent of the adhesives used in the layered films in Examples 1 to 4 and Comparative Examples 1 to 4 were measured. The results are shown in Table 1.

In the film-like polymer piezoelectric material (the polymer piezoelectric material before being layered) produced in the production example 1, the piezoelectric constant $d_{14}$, the degree of crystallinity, and the internal haze were measured.

Specifically, the measurement was performed as follows.

In the adhesive which cannot be made into a self-standing film at 25° C. after being dried, after an adhesive was coated onto a measuring tool, the adhesive was dried for 30 minutes in an oven set to 80° C., and an adhesive layer was formed on the measuring tool. The dynamic solid viscoelasticity (shear mode) of the adhesive layer was measured by using a measuring device (ARES manufactured by TA Instruments) under conditions of a measurement temperature of

TABLE 1

| | D1 (mm²) | D2 (mm²) | D1/D2 | Adhesive layer | Thickness of layered film (μm) | Thickness of adhesive layer (μm) | Tensile storage elastic modulus E' or shear storage elastic modulus G' × 3 | Loss tangent | Piezoelectric constant d14 (pm/V) |
|---|---|---|---|---|---|---|---|---|---|
| Example 1 | 1728 | 64 | 27 | JA-7562 | 217.7 | 10.7 | $5.01 \times 10^4$ | 0.485 | 18.4 |
| Example 2 | 1088 | 64 | 17 | JA-7562 | 224.0 | 17.0 | $5.01 \times 10^4$ | 0.485 | 17.6 |
| Comparative Example 1 | 448 | 64 | 7 | JA-7562 | 222.1 | 15.1 | $5.01 \times 10^4$ | 0.485 | 13.1 |
| Example 3 | 1728 | 64 | 27 | ARABIC YAMATO | 214.0 | 7.0 | $2.37 \times 10^8$ | 0.491 | 18.1 |
| Example 4 | 1728 | 64 | 27 | SK-DYNE 1499 | 244.3 | 37.3 | $9.66 \times 10^3$ | 0.075 | 17.4 |
| Comparative Example 2 | 448 | 64 | 7 | ARABIC YAMATO | 223.7 | 16.7 | $2.37 \times 10^8$ | 0.491 | 11.6 |
| Comparative Example 3 | 448 | 64 | 7 | SK-DYNE 1499 | 222.0 | 15.0 | $9.66 \times 10^3$ | 0.075 | 13.0 |
| Comparative Example 4 | 448 | 64 | 7 | EW2050 | 243.7 | 36.7 | $2.48 \times 10^8$ | 0.024 | 10.8 |

[D1/D2]

A sum of an area of an electric conductor provided on a principal surface of a polymer piezoelectric material (in the three-layered structure, each polymer piezoelectric material) in each layered film in Examples 1 to 4 and Comparative Examples 1 to 4 and an area of an electric conductor provided on the opposite surface of the polymer piezoelectric material (in the three-layered structure, each polymer piezoelectric material) is represented by D1 (mm²) Meanwhile, a sum of an area of a portion of the principal surface of the first polymer piezoelectric material 12 at which no electric conductor is provided and an area of a portion of the opposite surface of the first polymer piezoelectric material 12 at which no electric conductor is provided is represented by D2 (mm²). D1/D2 obtained by dividing D1 by D2 is calculated.

[Thickness of Adhesive Layer in Layered Film]

The thickness (μm) of each layered film in Examples 1 to 4 and Comparative Examples 1 to 4 was measured, and the thickness (μm) of the adhesive layer in the layered film is calculated in accordance with the following formula:

Thickness of adhesive layer=thickness of layered film−sum of film thicknesses before coating adhesive.

[Storage Elastic Modulus and Loss Tangent]

In an adhesive which can be made into a self-standing film at 25° C. after being dried, an adhesive was coated onto a Teflon (registered trademark) film, and another Teflon (registered trademark) film was further superposed thereon. After that, the layered body was pressed for 30 minutes by a pressing machine set to 80° C. and then dried, whereby an adhesive film was obtained. The obtained film was cut out into a size of 5 mm×30 mm, and the dynamic solid viscoelasticity (tensile mode) was measured by using a measuring device (RSA2 manufactured by Rheometrics, Inc) under conditions of a measurement temperature of 25° C. and a measurement frequency of 0.01 Hz, and the tensile storage elastic modulus E' (Pa) and the loss tangent were obtained.

25° C. and a measurement frequency of 0.01 Hz, and the shear storage elastic modulus G' (Pa) and the loss tangent were obtained.

When the shear storage elastic modulus G' is obtained from the dynamic solid viscoelasticity measurement, the shear storage elastic modulus G' was tripled and converted into E' by using the formula "E'=G'×3".

[Piezoelectric Constant $d_{14}$ (by Displacement Method)]

A difference distance between the maximal and minimum values of the displacement of the film when an alternating voltage of 10 Hz and 300 Vpp was applied to the resultant layered film of Examples 1 to 4 and Comparative Examples 1 to 4 was measured by a laser spectral-interference displacement meter SI-1000 manufactured by Keyence Corporation.

A value obtained by dividing a measured displacement (mp−p) by a reference length of the film of 30 mm was used as an amount of deformation, and a value obtained by multiplying a value, obtained by dividing the amount of deformation by an electric field strength ((applied voltage (V))/(film thickness)) applied to the film, by 2, was used as the piezoelectric constant $d_{14}$ (pm/V).

[Crystallinity]

Precise weighing of 5 mg of the film-like polymeric piezoelectric material in the production example 1 was performed, and it was measured on the condition of a rate of temperature increase of 10° C./min using a differential scanning calorimeter (DSC-1 manufactured by PerkinElmer, Inc.) to obtain a melt endothermic curve. The crystallinity was obtained from the obtained melt endothermic curve.

[Haze (Internal Haze)]

"Haze" or "transmission haze" in accordance with the present application refers to the internal haze of the polymeric piezoelectric material according to the present invention and is measured by a general method as a measuring method. Specifically, the internal haze value of the film-like polymeric piezoelectric material in the production example 1 was measured by measuring an optical transparency in a thickness direction using the apparatus described below under the measurement conditions described below. For the internal haze (hereinafter also referred to as an internal haze (H1)) of the polymeric piezoelectric material according to the present invention, the internal haze (H1) of the polymeric piezoelectric material according to the present invention was determined by measuring a haze (H2) with only silicone oil (Shin-Etsu Silicone (trademark) manufactured by Shin-Etsu Chemical Co., Ltd.; model number: KF96-100CS) previously sandwiched between two glass plates, then sandwiching a film, of which the surfaces were coated homogeneously with silicone oil, between two glass plates to measure a haze (H3), and determining a difference between them as in the following expression:

Internal haze($H1$)=Haze($H3$)−Haze($H2$)

In order to measure the haze value of each polymeric piezoelectric material in Examples and Comparative Examples, the internal haze (H1) of the polymeric piezoelectric material was calculated by measuring the optical transparency in the thickness direction from the haze (H2) and the haze (H3) using the apparatus described below under the measurement conditions described below.

Measuring apparatus: HAZE METER TC-HIIIDPK, manufactured by Tokyo Denshoku Co., Ltd.

Sample size: 3 mm in width×30 mm in length, 0.05 mm in thickness

Measurement condition: in conformity with JIS-K7105
Measurement temperature: room temperature (25° C.)

In the film-like polymer piezoelectric material (the polymer piezoelectric material before being layered) produced in the production example 1, when the piezoelectric constant $d_{14}$, the degree of crystallinity, and the internal haze were measured, the piezoelectric constant $d_{14}$ was 6 pm/V, the degree of crystallinity was 37.1%, and the internal haze was 0.7%.

JA-7562 as an adhesive used in Examples 1 and 2 and Comparative Example 1 was singly coated onto a measuring tool, and an adhesive layer having a thickness of 323 μm was formed. After that, the shear storage elastic modulus G' obtained as the result of the dynamic solid viscoelasticity measurement (shear mode) was 1.67×10$^4$ Pa, and G'×3 (=E') was 5.01×10$^4$ Pa, and the loss tangent was 0.485.

ARABIC YAMATO was singly used as an adhesive used in Example 3 and Comparative Example 2, and a film having a thickness of 237 μm was produced. After that, the tensile storage elastic modulus E' obtained as the result of the dynamic viscoelasticity measurement (tensile mode) was 2.37×10$^8$ Pa, and the loss tangent was 0.491.

SK-DYNE 1499 as an adhesive used in Example 4 and Comparative Example 3 was singly coated onto a measuring tool, and an adhesive layer having a thickness of 85 μm was formed. After that, the shear storage elastic modulus G' obtained as the result of the dynamic viscoelasticity measurement (shear mode) was 3.22×10$^3$ Pa, and G'×3 (=E') was 9.66×10$^3$ Pa, and the loss tangent was 0.075.

EW2050 was singly used as an adhesive used in Comparative Example 4, and a film having a thickness of 91 vim was produced. After that, the tensile storage elastic modulus E' obtained as the result of the dynamic viscoelasticity measurement (tensile mode) was 2.48×10$^8$ Pa, and the loss tangent was 0.024.

In the layered films in Examples 1 to 4 and Comparative Examples 1 to 4, the three polymer piezoelectric materials are layered. In the film-like polymer piezoelectric material produced in the production example 1, since the piezoelectric constant $d_{14}$ is 6 pm/V, it is preferable that the piezoelectric constant $d_{14}$ approaches 18 pm/V.

Figure 12:
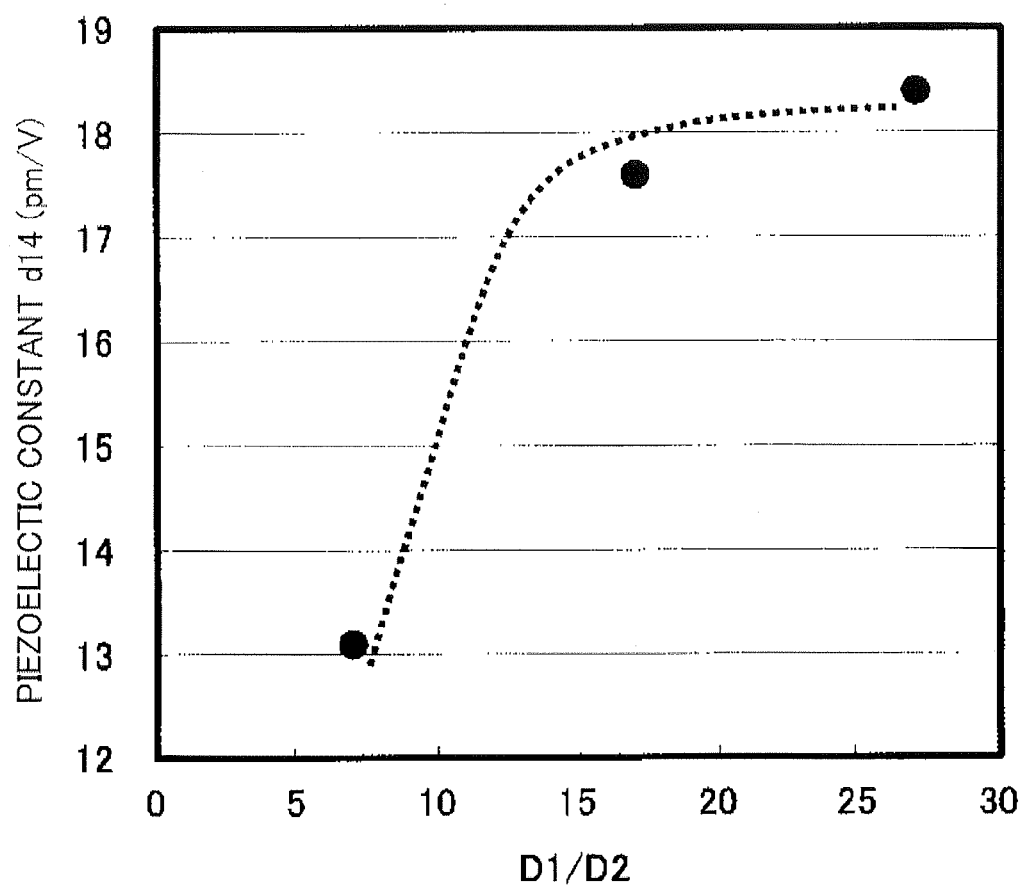
FIG. 12 is a graph showing a relation between D1/D2 and a piezoelectric constant $d_{14}$ in each layered film in Examples 1 and 2 and Comparative Example 1.

In the layered films in Examples 1 and 2 and Comparative Example 1 shown in Table 1, a graph of a relation between D1/D2 and the piezoelectric constant $d_{14}$ when the same adhesive JA-7562 was used is shown in FIG. 12.

As shown in Table 1 and FIG. 12, in any of the layered films in Examples 1 to 4, when end surface electric conductors formed of a silver paste are formed on end surfaces on both sides in the width direction of each of the layered films, the piezoelectric constant $d_{14}$ is not significantly lowered.

The entire disclosure of Japanese Patent Application No. 2012-128295 is incorporated by reference in this specification.

All contents of the documents, patent applications, and technical standards described in this specification are incorporated herein by reference to the same extent as that when it is specifically and individually described that the respective documents, patent applications, and the technical standards are incorporated herein by reference.

The invention claimed is:

1. A piezoelectric device, comprising:
    a polymer piezoelectric material having at least one film-like layer;
    a first electric conductor provided on a first surface of the polymer piezoelectric material;
    a second electric conductor provided on a second surface of the polymer piezoelectric material at an opposite side from the first electric conductor on the first surface;
    a first end surface electric conductor provided on one end surface in a width direction of the polymer piezoelectric material and disposed so as to be conductively connected to the first electric conductor and so as not to be in contact with the second electric conductor; and
    a second end surface electric conductor provided on any other end surface that is not the one end surface of the polymer piezoelectric material and disposed so as to be conductively connected to the second electric conductor and so as not to be in contact with the first electric conductor or the first end surface electric conductor,
    wherein the polymer piezoelectric material is configured to include a helical chiral polymer having a weight average molecular weight of from 50,000 to 1,000,000 and having optical activity, and a degree of crystallinity of the polymer piezoelectric material as obtained by a DSC method is from 20% to 80%,
    another polymer piezoelectric material having at least one film-like layer and a third electric conductor provided on a second surface side of the another polymer piezoelectric material are sequentially layered along a thickness direction on a surface of the second electric conductor formed on the second surface side of the polymer piezoelectric material, while the first end surface electric conductor extends on one end surface in a width direction of the another polymer piezoelectric material, the second end surface electric conductor extends on the other end surface in the width direction of the another polymer piezoelectric material, and the third electric conductor is disposed so as to be conductively connected to the first end surface electric conductor and so as not to be in contact with the second end surface electric conductor, and
    while one of the polymer piezoelectric material and the another polymer piezoelectric material is formed from a layer mainly composed of an L-isomer of the helical chiral polymer, the other of the polymer piezoelectric material and the another polymer piezoelectric material is formed from a layer mainly composed of a D-isomer of the helical chiral polymer, and the polymer piezoelectric material and the another polymer piezoelectric material are arranged so that a uniaxial stretching direction of the polymer piezoelectric material is the same as a uniaxial stretching direction of the another polymer piezoelectric material.

2. The piezoelectric device according to claim 1, wherein, when a sum of an area of the first electric conductor provided on the first surface of the polymer piezoelectric material and an area of the second electric conductor provided on the second surface is represented by D1, and when a sum of an area of the first surface at which the first electric conductor is not provided and an area of the second surface at which the second electric conductor is not provided is represented by D2, D1/D2 is 10 or more.

3. The piezoelectric device according to claim 1, further comprising an adhesive layer that adheres the polymer piezoelectric material and the first electric conductor or the second electric conductor to each other,
wherein a tensile storage elastic modulus E' of the adhesive layer, which is obtained from dynamic viscoelastic measurement at 25° C. as measured at a frequency of 0.01 Hz, is from $1 \times 10^2$ to $1 \times 10^9$ Pa.

4. The piezoelectric device according to claim 3, wherein a tensile storage elastic modulus E' of the adhesive layer, which is obtained from dynamic viscoelastic measurement at 25° C. as measured at a frequency of 0.01 Hz, is $1 \times 10^6$ Pa or more, and a loss tangent is 0.03 or more.

5. The piezoelectric device according to claim 1, wherein a transmission haze with respect to visible light of the polymer piezoelectric material is from 0.0% to 50%.

6. The piezoelectric device according to claim 1, wherein the helical chiral polymer is a polylactic acid polymer having a main chain that comprises a repeating unit represented by the following Formula (1):

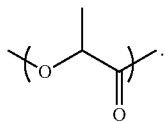

(1)

7. The piezoelectric device according to claim 1, wherein the helical chiral polymer has an optical purity of 95.00% ee or more.

8. A process for producing the piezoelectric device according to claim 1, the process comprising:

forming a first electric conductor on a first surface of a film-like polymer piezoelectric material, except for at a first part at the other end in the width direction and forming a second electric conductor on a second surface at an opposite side from the first electric conductor, except for at a second part at the one end in the width direction;

forming a third electric conductor on a second surface of another film-like polymer piezoelectric material, except for at a third part at the other end in the width direction;

adhering a first surface at an opposite side from the third electric conductor on the second surface of the another polymer piezoelectric material to the second surface of the polymer piezoelectric material on which the second electric conductor is formed via an adhesive layer;

forming a first end surface electric conductor on the one end surface in the width direction of the polymer piezoelectric material and the another polymer piezoelectric material so that the first end surface electric conductor is in contact with the first electric conductor and the third electric conductor and is not in contact with the second electric conductor; and forming a second end surface electric conductor on the other end surface in the width direction of the polymer piezoelectric material and the another polymer piezoelectric material so that the second end surface electric conductor is in contact with the second electric conductor and is not in contact with the first electric conductor or the third electric conductor.

* * * * *